(12) United States Patent
Tanaka

(10) Patent No.: US 12,557,618 B2
(45) Date of Patent: Feb. 17, 2026

(54) SEMICONDUCTOR DEVICE

(71) Applicant: ROHM CO., LTD., Kyoto (JP)

(72) Inventor: Bungo Tanaka, Kyoto (JP)

(73) Assignee: ROHM CO., LTD., Kyoto (JP)

(*) Notice: Subject to any disclaimer, the term of this patent is extended or adjusted under 35 U.S.C. 154(b) by 656 days.

(21) Appl. No.: 17/801,962

(22) PCT Filed: Mar. 3, 2021

(86) PCT No.: PCT/JP2021/008138
§ 371 (c)(1),
(2) Date: Aug. 24, 2022

(87) PCT Pub. No.: WO2021/182225
PCT Pub. Date: Sep. 16, 2021

(65) Prior Publication Data
US 2023/0083880 A1    Mar. 16, 2023

(30) Foreign Application Priority Data
Mar. 12, 2020 (JP) .................... 2020-043119

(51) Int. Cl.
H01L 21/762 (2006.01)
H10D 84/01 (2025.01)
H10D 84/03 (2025.01)

(52) U.S. Cl.
CPC .. *H01L 21/76229* (2013.01); *H01L 21/76264* (2013.01); *H10D 84/0151* (2025.01); *H10D 84/038* (2025.01)

(58) Field of Classification Search
CPC ........... H10D 84/0151; H10D 84/0153; H10D 84/0188
See application file for complete search history.

(56) References Cited

U.S. PATENT DOCUMENTS

2008/0173949 A1* 7/2008 Ma ..................... H10D 84/0188
257/E21.644
2010/0032767 A1* 2/2010 Chapman ............. H10D 84/854
257/E21.546

(Continued)

FOREIGN PATENT DOCUMENTS

JP      2015037099 A    2/2015
JP      2017183396 A    10/2017

(Continued)

OTHER PUBLICATIONS

International Search Report for PCT/JP2021/008138, mailed on Apr. 27, 2021.

(Continued)

*Primary Examiner* — Matthew C Landau
*Assistant Examiner* — Nora T. Nix
(74) *Attorney, Agent, or Firm* — Rabin & Berdo, P.C.

(57) ABSTRACT

A semiconductor device includes a semiconductor layer, an element isolation portion that is formed at the semiconductor layer and that defines an element region in the semiconductor layer, and a first contact that is formed in a linear shape along the element isolation portion in a plan view and that is electrically connected to the element isolation portion. The semiconductor device further includes a semiconductor substrate supporting the semiconductor layer and a buried layer formed so as to be contiguous to the semiconductor layer, and the element isolation portion may reach the semiconductor substrate through the buried layer from a front surface of the semiconductor layer.

12 Claims, 17 Drawing Sheets

(56) References Cited

U.S. PATENT DOCUMENTS

| | | | | |
|---|---|---|---|---|
| 2015/0041960 A1* | 2/2015 | Morii | ................ | H01L 21/31111 |
| | | | | 257/621 |
| 2016/0163583 A1* | 6/2016 | Liu | ..................... | H10D 62/126 |
| | | | | 438/430 |
| 2018/0102250 A1* | 4/2018 | Ningaraju | ............ | H10D 62/158 |
| 2018/0151410 A1* | 5/2018 | Usami | ................ | H10D 84/0186 |
| 2018/0261530 A1* | 9/2018 | Sekikawa | ............. | H01L 23/585 |
| 2020/0343145 A1* | 10/2020 | Kang | ................. | H10D 30/0227 |

FOREIGN PATENT DOCUMENTS

| | | | |
|---|---|---|---|
| JP | 2017183403 A | 10/2017 | |
| WO | 2018020713 A1 | 2/2018 | |

OTHER PUBLICATIONS

Written Opinion of the International Searching Authority for PCT/JP2021/008138, mailed on Apr. 27, 2021.
Japanese Office Action dated Jan. 9, 2025, in the counterpart Japanese patent application No. 2022-505968.

* cited by examiner

SEMICONDUCTOR DEVICE

TECHNICAL FIELD

The present disclosure relates to a semiconductor device.

BACKGROUND ART

For example, Patent Literature 1 discloses a semiconductor device that includes an active layer that is placed inside an SOI substrate and at which an element forming a circuit is formed, a buried insulating layer that is placed inside the SOI substrate and that is contiguous to the active layer, a DTI (Deep Trench Isolation) region that is formed at the active layer so as to surround the entirety of the periphery of a formation region of the element in a plan view and that reaches a rear surface of the active layer from a front surface of the active layer, and a first conductive film formed above the element, and, in the semiconductor device, the DTI region has a first hole inside the DTI region, and the film thickness of the first conductive film is thicker than the thickness of the active layer.

CITATION LIST

Patent Literature

Patent Literature 1: Japanese re-publication of PCT international application No. WO2018/020713

SUMMARY OF INVENTION

Solution to Problem

A semiconductor device according to a preferred embodiment of the present disclosure includes a semiconductor layer, an element isolation portion that is formed at the semiconductor layer and that defines an element region in the semiconductor layer, and a first contact that is formed in a linear shape along the element isolation portion in a plan view and that is electrically connected to the element isolation portion.

DESCRIPTION OF EMBODIMENTS

Preferred Embodiments of Present Disclosure

Figure 1:
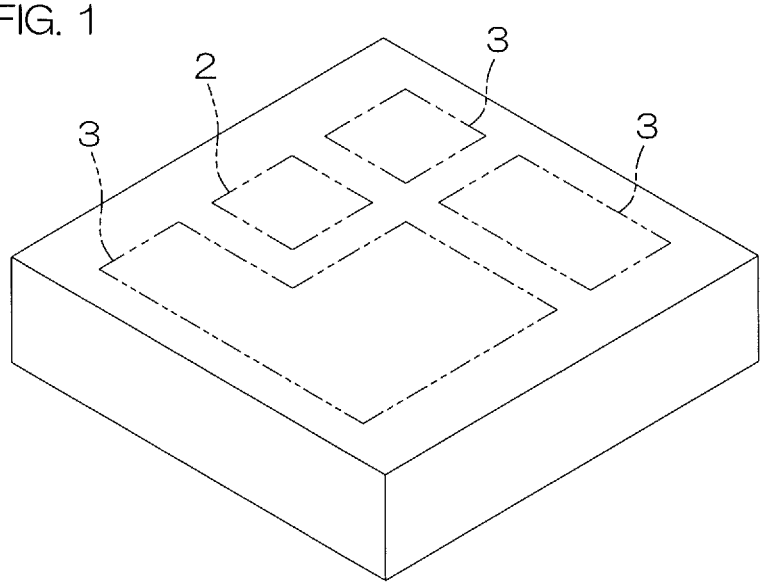
FIG. 1 is a schematic perspective view of a semiconductor device according to a first preferred embodiment of the present disclosure.

First, preferred embodiments of the present disclosure will be described in an itemized form.

A semiconductor device according to a preferred embodiment of the present disclosure includes a semiconductor layer, an element isolation portion that is formed at the semiconductor layer and that defines an element region in the semiconductor layer, and a first contact that is formed in a linear shape along the element isolation portion in a plan view and that is electrically connected to the element isolation portion.

According to this configuration, the first contact is formed in a linear shape, and therefore it is possible to restrain contact resistance against the element isolation portion more excellently than in a case in which it is formed in, for example, a dot shape.

The semiconductor device according to one preferred embodiment of the present disclosure further includes a semiconductor substrate supporting the semiconductor layer and a buried layer formed so as to be contiguous to the semiconductor layer, and the element isolation portion may reach the semiconductor substrate through the buried layer from a front surface of the semiconductor layer.

In the semiconductor device according to one preferred embodiment of the present disclosure, the semiconductor substrate may include a first conductive type semiconductor substrate, the semiconductor layer may include a second conductive type semiconductor layer having a first impurity concentration, the buried layer may include a buried layer having a second impurity concentration higher than the first impurity concentration, and the element region may include a first conductive type body region formed at a front surface portion of the semiconductor layer and a second conductive type source region formed in the body region.

According to this configuration, an npnp parasitic thyristor is formed by the second conductive type source region, the first conductive type body region, the second conductive type semiconductor layer, and the first conductive type semiconductor substrate. For example, if the first conductivity type is a p type and if the second conductivity type is an n type, an npnp parasitic thyristor is formed. On the other hand, if the first conductivity type is an n type and if the second conductivity type is a p type, a pnpn parasitic thyristor is formed.

There is a case in which this type of parasitic thyristor is turned on because of, for example, ESD (Electro-Static Discharge). Therefore, there is a possibility that a localized high electric current will be generated in a MISFET that includes the source region and the body region, thus leading to destruction. On the other hand, according to this configuration, it is possible to efficiently absorb a substrate current by means of the first contact connected to the element isolation portion with comparatively low contact resistance. As a result, it is possible to improve an ESD withstand current rating of the semiconductor device.

In the semiconductor device according to one preferred embodiment of the present disclosure, the element isolation portion may include a trench, a first insulating film formed at a side surface of the trench, and an electroconductive first buried body that is buried in an inside of the first insulating film and that is connected to the semiconductor substrate, and the first contact may be connected to the first buried body.

If the trench includes a first trench and a second trench, which is formed in the front surface portion of the semiconductor layer so as to be continuous from an upper end of the first trench and which has a width wider than the first trench and which has a depth shallower than the first trench, the semiconductor device according to the one preferred embodiment of the present disclosure may further include an insulative second buried body buried in the second trench.

In the semiconductor device according to one preferred embodiment of the present disclosure, the first buried body may include a first projection portion that selectively protrudes into the second trench, and the first contact may be connected to the first projection portion.

In the semiconductor device according to one preferred embodiment of the present disclosure, the first buried body may have a second upper surface that is formed at one side and one other side between which the first projection portion is sandwiched in a direction intersecting a direction in which the first contact extends and that is formed at a level lower than a first upper surface of the first projection portion.

In the semiconductor device according to one preferred embodiment of the present disclosure, the first insulating film may be formed at a side surface of the first trench, and may protrude to a higher position than the second upper surface of the first buried body.

In the semiconductor device according to one preferred embodiment of the present disclosure, a depth of the first trench may be 2 μm to 100 μm, and a depth of the second trench may be 0.05 μm to 2 μm.

In the semiconductor device according to one preferred embodiment of the present disclosure, the first trench may include DTI (Deep Trench Isolation), and the second trench may include STI (Shallow Trench Isolation).

In the semiconductor device according to one preferred embodiment of the present disclosure, a thickness of an upper portion of the first insulating film may become thinner in proportion to progress toward an upper side in a depth direction of the first trench.

In the semiconductor device according to one preferred embodiment of the present disclosure, the first insulating film may include a first surface contiguous to the side surface of the first trench, a second surface that is formed in substantially parallel with the first surface and that is contiguous to the first buried body, and a third surface that is continuous from the second surface in the upper portion of the first insulating film and that is inclined toward the first surface.

In the semiconductor device according to one preferred embodiment of the present disclosure, the first contact may include a plurality of first contacts that extend while being arranged side by side with each other.

In the semiconductor device according to one preferred embodiment of the present disclosure, the element isolation portion may be formed in a closed annular shape in a plan view, and the first contact may include a first contact that is linear along the element isolation portion and that is formed in a closed annular shape.

In the semiconductor device according to one preferred embodiment of the present disclosure, the element isolation portion may be formed in a closed annular shape in a plan view, and the first contact may include a plurality of first contacts formed intermittently along the element isolation portion.

In the semiconductor device according to one preferred embodiment of the present disclosure, the first contact may be configured to be connected to a ground potential.

Detailed Description of Preferred Embodiments of Present Disclosure

Next, preferred embodiments of the present disclosure will be described in detail with reference to the accompanying drawings.

First Preferred Embodiment

<<Entire Configuration of Semiconductor Device 1>>

FIG. 1 is a schematic perspective view of a semiconductor device 1 according to a first preferred embodiment of the present disclosure.

The semiconductor device 1 includes, for example, a chip-shaped integrated circuit (IC: Integrated Circuit) device. The semiconductor device 1 may be referred to as SSI (Small Scale IC), MSI (Middle Scale IC), LSI (Large Scale IC), VLSI (Very Large Scale IC), or ULSI (Ultra Large Scale IC) based on the number of circuit elements to be integrated.

The semiconductor device 1 has a plurality of element regions 2 and 3 in which circuit elements are formed. The plurality of element regions 2 and 3 are formed at a shared semiconductor layer 5 described later.

The plurality of element regions 2 and 3 include the first element region 2 and a plurality of second element regions 3. The first element region 2 may be an element region in which LDMOS (Lateral double-diffused MOS) is formed as a circuit element. The plurality of second element regions 3 may be regions in which other functional elements (for example, a protection diode, a resistor, a capacitor, etc., for LDMOS) are formed. The semiconductor device 1 may have more element regions although the four element regions 2 and 3 are shown in FIG. 1.

Figure 2:
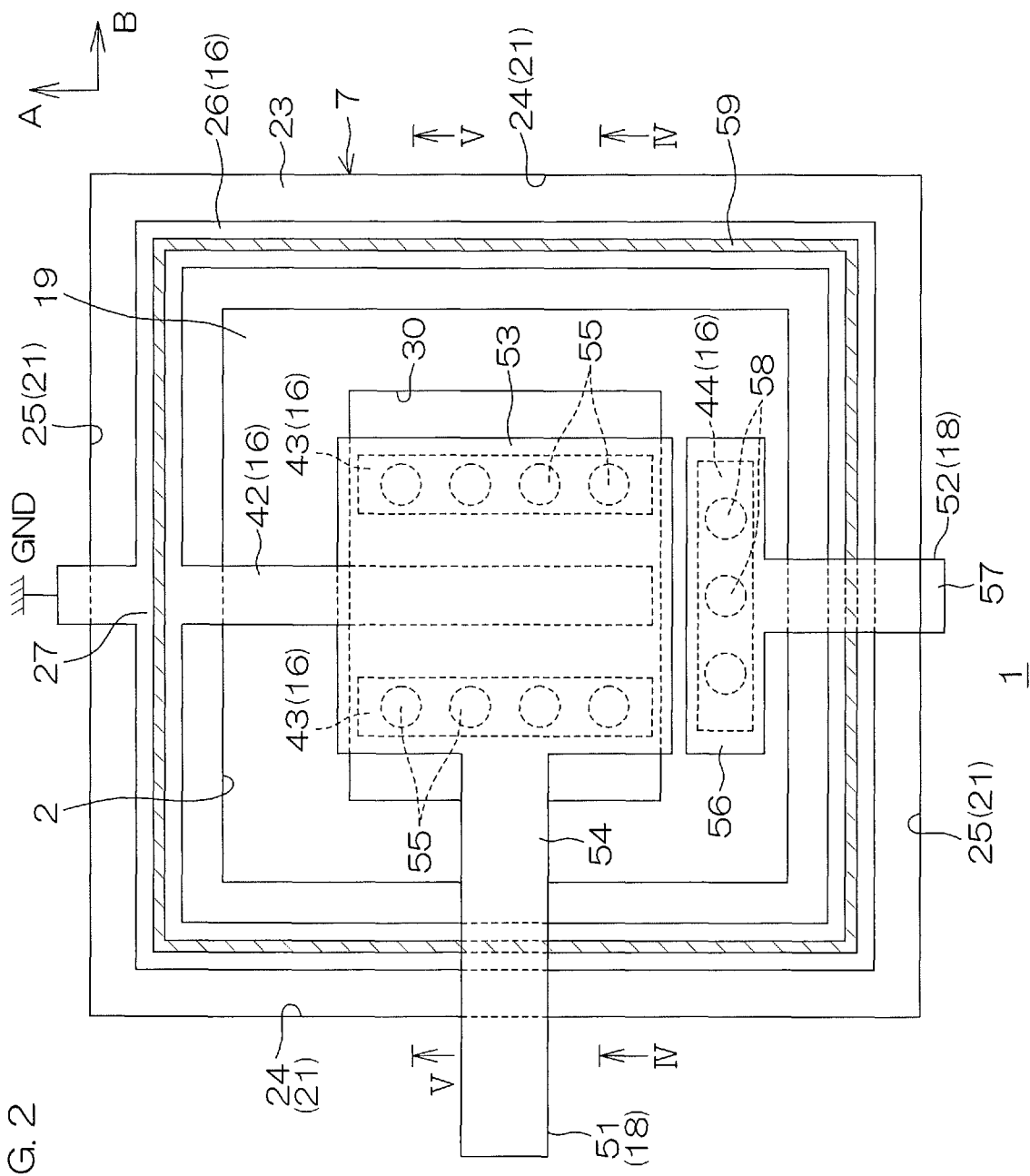
FIG. 2 is a schematic plan view of the semiconductor device showing a first element region of FIG. 1.
Figure 3:
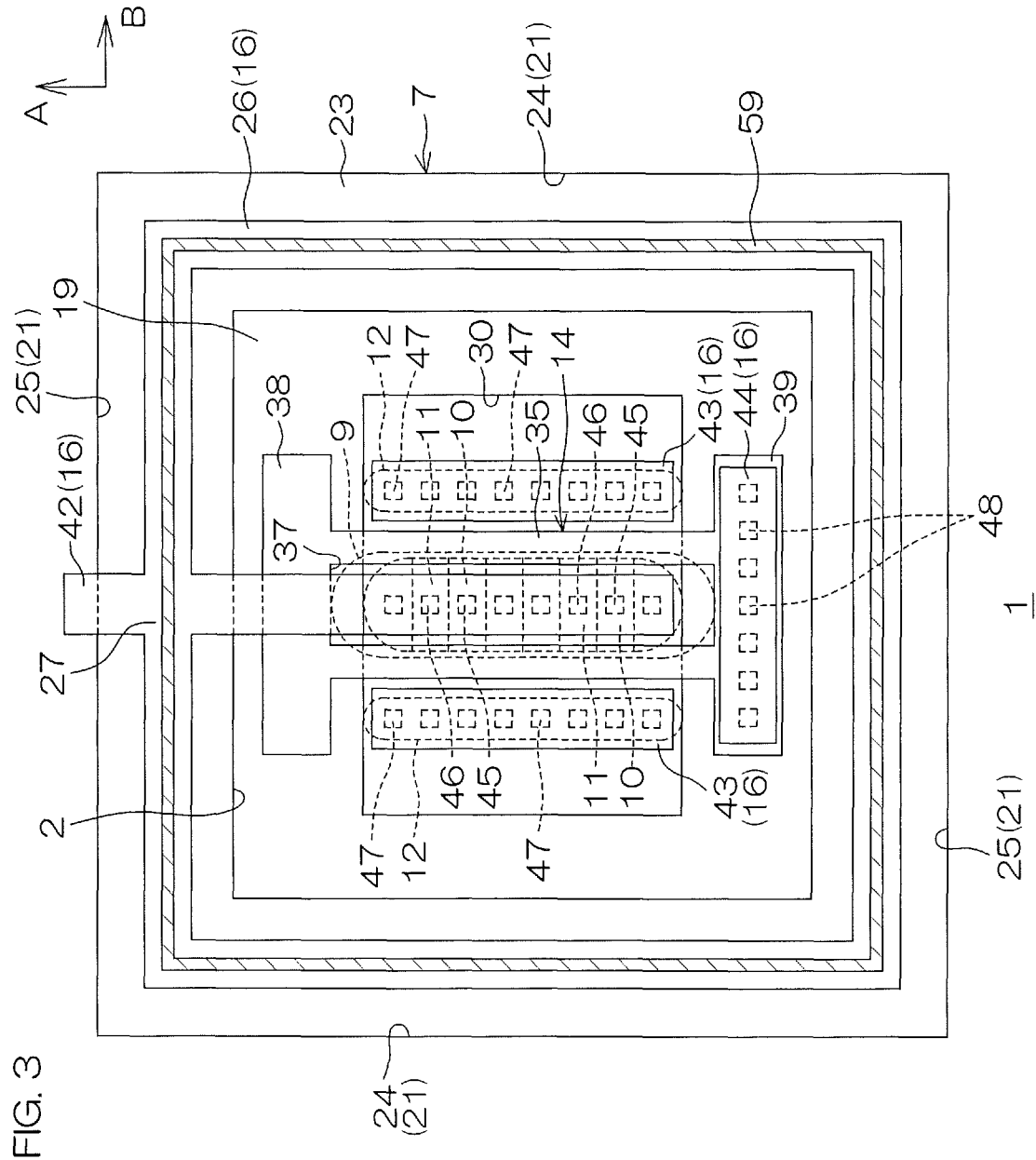
FIG. 3 is a plan view of the semiconductor device in which a structure on a second interlayer insulating film has been removed from FIG. 2.
Figure 4:
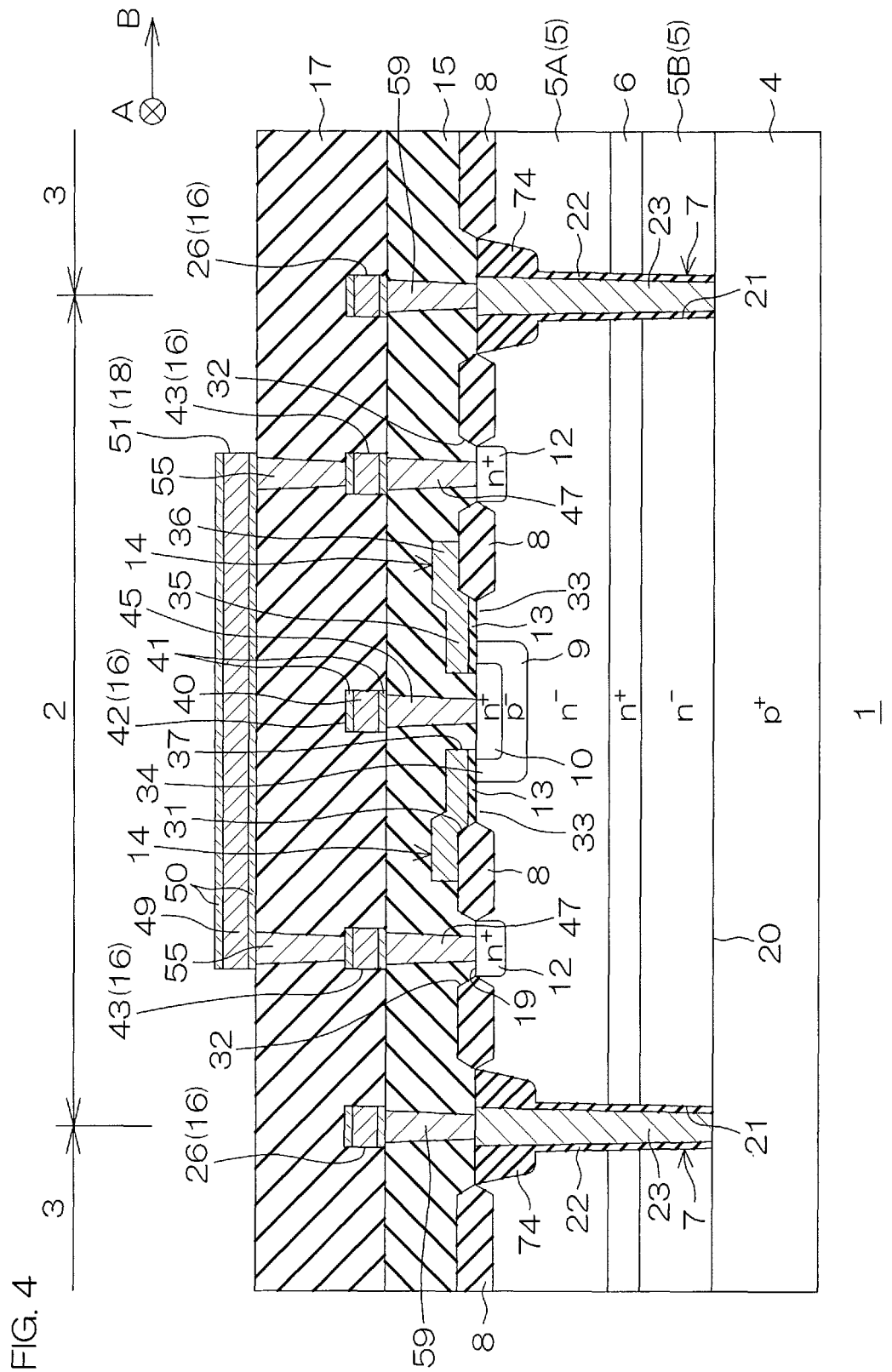
FIG. 4 is a cross-sectional view showing a cross section along line IV-IV of FIG. 2.
Figure 5:
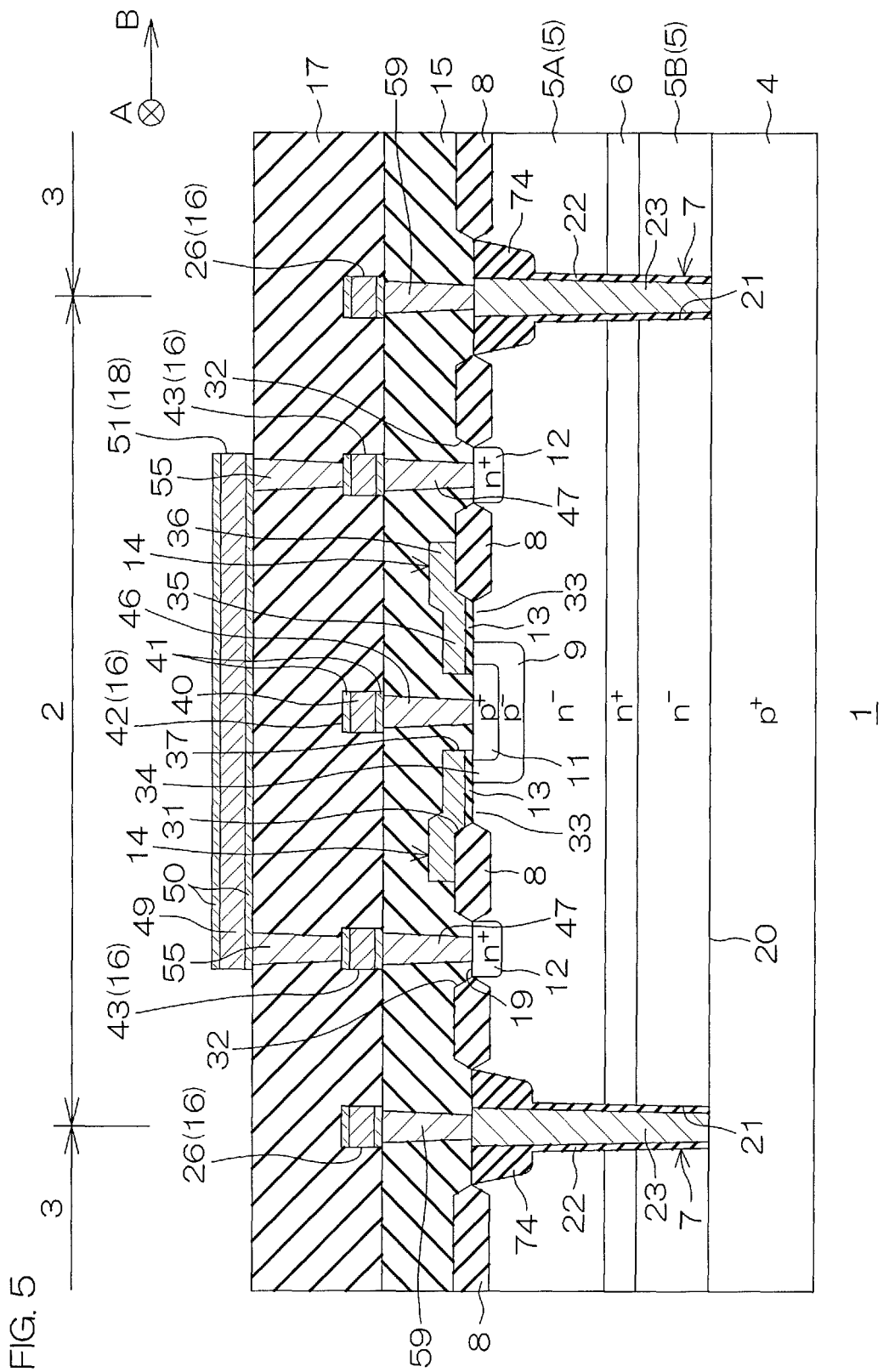
FIG. 5 is a cross-sectional view showing a cross section along line V-V of FIG. 2.

FIG. 2 is a schematic plan view of the semiconductor device 1 showing the first element region 2 of FIG. 1. FIG. 3 is a plan view of the semiconductor device 1 in which a structure on the second interlayer insulating film 17 has been removed from FIG. 2. FIG. 4 is a cross-sectional view showing a cross section along line IV-IV of FIG. 2. FIG. 5 is a cross-sectional view showing a cross section along line V-V of FIG. 2.

The semiconductor device 1 may include a semiconductor substrate 4, a semiconductor layer 5, a buried layer 6, an element isolation portion 7, a field insulating film 8, a body region 9, a source region 10, a body contact region 11, a drain region 12, a gate insulating film 13, a gate electrode 14, a first interlayer insulating film 15, a first wiring layer 16, a second interlayer insulating film 17, and a second wiring layer 18.

The semiconductor substrate 4 is made of a single-crystal silicon (Si) substrate in the present preferred embodiment, and yet may be a substrate made of another material (such as silicon carbide (SiC)). The semiconductor substrate 4 is a p⁺ type in the present preferred embodiment. The semiconductor substrate 4 may have an impurity concentration of, for example, $1 \times 10^{19}$ cm⁻³ to $5 \times 10^{21}$ cm⁻³. Additionally, the thickness of the semiconductor substrate 4 may be, for example, 500 μm to 800 μm, when the semiconductor substrate 4 is in a not-yet-ground state.

The semiconductor layer 5 is formed on the semiconductor substrate 4. The semiconductor layer 5 has an element principal surface 19 and a junction surface 20 that faces an opposite side of the element principal surface 19 in a thickness direction of the semiconductor layer 5. The element principal surface 19 is a surface at which the element regions 2 and 3 are formed. On the other hand, the junction surface 20 is a surface contiguous to the semiconductor substrate 4.

The semiconductor layer 5 has a conductivity type opposite to that of the semiconductor substrate 4, and is an n⁻ type in the present preferred embodiment. The semiconductor layer 5 may have an impurity concentration of, for example, $5 \times 10^{14}$ cm⁻³ to $1 \times 10^{17}$ cm⁻³. Additionally, the thickness of the semiconductor layer 5 may be, for example, 3 μm to 20 μm. Additionally, the semiconductor layer 5 may be a layer formed by, for example, epitaxial growth with respect to the semiconductor substrate 4, and, in that case, may be referred to as an epitaxial layer.

The buried layer 6 may be formed between both ends in the thickness direction of the semiconductor layer 5 as shown in FIGS. 4 and 5, or may be sandwiched between the semiconductor substrate 4 and the semiconductor layer 5. In the present preferred embodiment, the buried layer 6 straddles between the plurality of element regions 2 and 3, and is distributed at the same depth position in the thickness direction of the semiconductor layer 5. Additionally, the semiconductor layer 5 is divided upwardly and downwardly in the thickness direction by means of the buried layer 6. Hence, the semiconductor layer 5 may include an upper semiconductor layer 5A placed on the upper side (element-principal-surface-19 side) with respect to the buried layer 6 and a lower semiconductor layer 5B placed on the lower side (junction-surface-20 side) with respect to the buried layer 6. The upper semiconductor layer 5A may be thicker or thinner than the lower semiconductor layer 5B.

The buried layer 6 has the same conductivity type as the semiconductor layer 5, and is an n⁺ type layer having an impurity concentration higher than the semiconductor layer 5 in the present preferred embodiment. The thickness of the buried layer 6 may be, for example, 2 μm to 3 μm.

The element isolation portion 7 is formed in a closed annular shape in the present preferred embodiment. The element isolation portion 7 may include a trench 21, a first insulating film 22, and a first buried layer 23. The trench 21 is a trench by which the element regions 2 and 3 are defined, and therefore may be referred to as an element-isolating trench.

The trench 21 may be formed so as to pass through the buried layer 6 from the element principal surface 19 of the semiconductor layer 5 and to reach the semiconductor substrate 4. Additionally, the trench 21 may have a bottom portion in the semiconductor substrate 4.

The trench 21 may include a linear first portion 24 extending in a first direction A and a linear second portion 25 extending in a second direction B perpendicular to the first direction A as shown in FIGS. 2 and 3. The term "linear" may denote that specific limitations are not imposed if the trench is a slender trench by which the element regions 2 and 3 are defined, and it is straight as shown in FIGS. 2 and 3 or is curved.

Additionally, in the semiconductor layer 5, the second element region 3, which is electrically floated in the same way as the first element region 2, is defined in an outer peripheral region of the first element region 2. The second element region 3 may be formed so as to be adjacent to the first element region 2 with the element isolation portion 7 between the second element region 3 and the first element region 2, or may be formed by an element-isolating structure (not shown) (for example, the same trench structure as the element isolation portion 7) in a region away from the first element region 2. The first element region 2 may be a low-voltage element region that works on the basis of a low reference voltage of, for example, about 5 V to 100 V, or may be a high-voltage element region that works on the basis of a high reference voltage of, for example, about 400 V to 600 V.

The first insulating film 22 is formed on an inner surface of the trench 21. Additionally, the first insulating film 22 is made of silicon oxide (SiO₂) in the present preferred embodiment, and yet may be made of another insulating material (such as a silicon nitride oxide film (SiON)).

The first buried layer 23 is buried inside the first insulating film 22 in the trench 21. The first buried layer 23 may be buried from a bottom portion of the trench 21 to the element principal surface 19 of the semiconductor layer 5. The first buried layer 23 may be made of polysilicon in the present preferred embodiment.

The field insulating film 8 is formed in a band shape drawing a closed curve although its end edge is not specifically shown in FIGS. 2 and 3. The field insulating film 8 is formed in a quadrangular annular shape so as to surround the periphery of the first element region 2 in a plan view in the same way as the element isolation portion 7. The range of an active region 30 that is surrounded by the field insulating film 8 and in which a MISFET is formed is schematically shown in FIGS. 2 and 3. In the first element region 2, a region other than the active region 30 is a region in which the body region 9 is formed, and yet may be a region in which the source region 10 and the body contact region 11 are not formed.

The field insulating film 8 may be a LOCOS film formed by, for example, selectively oxidizing the element principal surface 19 of the semiconductor layer 5. The field insulating film 8 has a first opening 31 that exposes the body region 9 and the source region 10 and a second opening 32 that exposes the drain region 12.

The body region 9 is formed at the element principal surface 19 of the semiconductor layer 5. The body region 9 is away inwardly from a peripheral edge portion of the first opening 31 of the field insulating film 8. An annular region that is sandwiched between an outer peripheral edge of the body region 9 and a peripheral edge portion of the field insulating film 8 and that is defined by a part of the semiconductor layer 5 is a semiconductor region 33 having the same conductivity type as the semiconductor layer 5.

The body region 9 is formed so as to extend in the first direction A. For example, the body region 9 may be slender along the first direction A. The body region 9 is a p⁻ type semiconductor region in the present preferred embodiment. The body region 9 has an impurity concentration of, for example, $1 \times 10^{17}$ cm⁻³ to $1 \times 10^{18}$ cm⁻³. Additionally, the depth of the body region 9 is deeper than the position of a bottom portion of the field insulating film 8 as shown in FIGS. 4 and 5, and may be, for example, 0.5 µm to 4.0 µm.

The source region 10 and the body contact region 11 are formed in an inward region of the body region 9 in the element principal surface 19 of the semiconductor layer 5. The source region 10 and the body contact region 11 respectively have outer peripheral edges that are away inwardly from the outer peripheral edge of the body region 9 and that are along the outer peripheral edge of the body region 9. A region that is sandwiched between the outer peripheral edge of the body region 9 and an outer peripheral edge of the source region 10 and that is formed by the body region 9 is a body region 34 in which a channel is formed when an appropriate voltage is applied to the gate electrode 14.

A plurality of source regions 10 and a plurality of body contact regions 11 are alternately formed along the first direction A. The source region 10 and the body contact region 11 that adjoin each other are in contact with each other.

The source region 10 is an n$^+$ type semiconductor region in the present preferred embodiment. The source region 10 has an impurity concentration of, for example, $1 \times 10^{19}$ cm$^{-3}$ to $5 \times 10^{21}$ cm$^{-3}$. Additionally, the depth of the source region 10 is shallower than the body region 9, and may be, for example, 0.2 µm to 1.0 µm. Therefore, the source region 10 has its side portion and its bottom portion both of which are integrally covered by the body region 9 in a cross-sectional view.

The body contact region 11 is a p$^+$ type semiconductor region in the present preferred embodiment, and has an impurity concentration higher than that of the body region 9. The body contact region 11 has an impurity concentration of, for example, $1 \times 10^{19}$ cm$^{-3}$ to $5 \times 10^{21}$ cm$^{-3}$. Additionally, the depth of the body contact region 11 is shallower than the body region 9, and may be, for example, 0.2 µm to 1.0 µm. Therefore, the body contact region 11 has its side portion and its bottom portion both of which are integrally covered by the body region 9 in a cross-sectional view.

The drain region 12 is formed at the element principal surface 19 of the semiconductor layer 5. The drain region 12 is away from the body region 9 in the second direction B, and has an outer peripheral edge along a peripheral edge portion of the second opening 32 of the field insulating film 8. Additionally, a pair of the drain regions 12 may be formed so as to face each other with the source region 10 between the drain regions 12 in the second direction B. Each of the drain regions 12 extends along the first direction A. In the present preferred embodiment, the drain region 12 is formed so as to be slender along the first direction A.

The drain region 12 is an n$^+$ type semiconductor region in the present preferred embodiment. The drain region 12 has an impurity concentration of, for example, $1 \times 10^{19}$ cm$^{-3}$ to $5 \times 10^{21}$ cm$^{-3}$. Additionally, the depth of the drain region 12 may be, for example, 0.2 µm to 2.0 µm. For example, the drain region 12 may have the same depth as the source region 10.

The gate insulating film 13 is formed at the element principal surface 19 of the semiconductor layer 5. More specifically, the gate insulating film 13 is formed in a region ranging from the outer peripheral edge of the source region 10 to the peripheral edge portion of the first opening 31 of the field insulating film 8, and is united with the field insulating film 8, and covers the body region 34 and the semiconductor region 33.

The gate insulating film 13 is made of silicon oxide (SiO$_2$) in the present preferred embodiment, and yet may be made of another insulating material (such as a silicon nitride oxide film (SiON)). Additionally, the thickness of the gate insulating film 13 is thinner than the field insulating film 8, and may be, for example, 2 nm to 55 nm.

The gate electrode 14 is formed on the gate insulating film 13. The gate electrode 14 faces the body region 34 and the semiconductor region 33 across the gate insulating film 13, and continuously extends from the surface of the gate insulating film 13 to the surface of the field insulating film 8. Hence, the gate electrode 14 covers a part of the field insulating film 8. A part, which faces the body region 34, of the gate electrode 14 may be referred to as a main body portion 35 of the gate electrode 14. Additionally, a part, which is placed on the field insulating film 8, of the gate electrode 14 may be referred to as, for example, a field plate 36.

In the present preferred embodiment, the gate electrode 14 is formed in an annular shape surrounding the source region 10 as shown in FIG. 3, and has an opening 37 that exposes the source region 10. The source region 10 is formed larger than the opening 37 as shown in FIGS. 3 and 4, and overlaps with a peripheral edge portion of the opening 37. In other words, the peripheral edge portion of the opening 37 is adjacent to the source region 10 in the thickness direction of the semiconductor layer 5. Additionally, the opening 37 is an opening by which the source region 10 is mainly exposed in the present preferred embodiment, and may be referred to as, for example, an opening for a source contact.

The main body portion 35 of the gate electrode 14 may be formed in a slender shape (substantially rectangular shape) along the first direction A. Additionally, the gate electrode 14 may include extension portions 38 and 39 that extend from the main body portion 35 toward the outside of the source region 10 in the first direction A. The extension portions 38 and 39 are formed such that the pair of the main body portions 35 facing each other with the opening 37 between the main body portions 35 in the second direction B are united with each other in the present preferred embodiment.

The extension portions 38 and 39 are formed outside the active region 30. The extension portions 38 and 39 may be referred to as an outer peripheral portion of the gate electrode 14. Additionally, the extension portions 38 and 39 may be formed in a slender shape (substantially rectangular shape) along the second direction B. The extension portions 38 and 39 may have a first extension portion 38 formed on one side of the main body portion 35 and a second extension portion 39 formed on the other side of the main body portion 35 in the first direction A. The second extension portion 39 may be a region for a contact with respect to the gate electrode 14. Therefore, the second extension portion 39 may be referred to as a contact portion of the gate electrode 14.

Additionally, the gate electrode 14 includes, for example, an n$^+$ type polysilicon gate electrode that contains n type impurities in the present preferred embodiment. The gate electrode 14 has an impurity concentration of, for example, $1 \times 10^{19}$ cm$^{-3}$ to $5 \times 10^{21}$ cm$^{-3}$.

The first interlayer insulating film 15 is formed at the element principal surface 19 of the semiconductor layer 5. The first interlayer insulating film 15 covers the body region 9, the source region 10, the body contact region 11, the drain region 12, and the gate electrode 14. The first interlayer insulating film 15 is made of silicon oxide (SiO$_2$) in the present preferred embodiment, and yet may be made of another insulating material (such as silicon nitride (SiN)). Additionally, the first interlayer insulating film 15 may be formed so as to have a layered structure made of a plurality of materials, such as silicon oxide and silicon nitride. Additionally, the thickness of the first interlayer insulating film 15 may be, for example, 0.3 µm to 2.0 µm.

The first wiring layer 16 is formed on the first interlayer insulating film 15. The first wiring layer 16 includes a main layer 40 (for example, aluminum (Al) layer) and a barrier layer 41 (for example, Ti/TiN layered structure) by which the main layer 40 is sandwiched from the up-down direction in the present preferred embodiment, and yet may be made of another conductive material (for example, copper (Cu)).

The first wiring layer 16 may include a first source wiring layer 42, a first contact wiring layer 26, a first drain wiring layer 43, and a first gate wiring layer 44.

The first source wiring layer 42 is formed on the source region 10 and the body contact region 11. The first source wiring layer 42 crosses the element isolation portion 7 from the active region 30, and is drawn out toward the outside of the first element region 2. Additionally, the first source wiring layer 42 may be connected to a ground potential at a position not shown.

The first source wiring layer 42 is connected to the source region 10 and to the body contact region 11 by means of a source contact 45 and a body contact 46 both of which have been buried in the first interlayer insulating film 15. A plurality of the source contacts 45 and a plurality of the body contacts 46 are arranged in a dot shape with intervals therebetween along the first direction A. Additionally, the source contact 45 and the body contact 46 are made of tungsten (W) in the present preferred embodiment, and yet may be made of other conductive materials (such as aluminum (Al) and copper (Cu)). In that case, needless to say, a barrier layer, such as TiN, may be used.

The first contact wiring layer 26 integrally branches from the first source wiring layer 42. Therefore, the first contact wiring layer 26 may be connected to the ground potential through the first source wiring layer 42. The first contact wiring layer 26 may have a connection portion 27 with the first source wiring layer 42 on the element isolation portion 7, for example, as shown in FIGS. 2 and 3. In other words, the first contact wiring layer 26 may branch from the first source wiring layer 42 on the element isolation portion 7.

Additionally, the first contact wiring layer 26 may be formed in a linear shape along the linear element isolation portion 7 (trench 21) in a plan view as shown in FIGS. 2 and 3. In other words, the first contact wiring layer 26 may extend along the element isolation portion 7 in a region on the linear element isolation portion 7 (trench 21). In the first contact wiring layer 26, its entirety may be formed in a region on the element isolation portion 7, or, alternatively, its part may be formed in a region on the element isolation portion 7, and its other parts may be formed in regions other than the region placed on the element isolation portion 7. In the latter case, a part of the first contact wiring layer 26 may cross the element isolation portion 7 in a plan view. In the present preferred embodiment, the first contact wiring layer 26 is formed so as to be linear along the element isolation portion 7 and so as to have a closed annular shape in a plan view. In other words, the first contact wiring layer 26 is formed so as to have a closed annular shape that overlaps with the element isolation portion 7 over the whole periphery of the first contact wiring layer 26.

The first contact wiring layer 26 is connected to the first buried layer 23 by means of a first contact 59 buried in the first interlayer insulating film 15. As shown in FIGS. 2 and 3, the first contact 59 may be formed in a linear shape along the linear element isolation portion 7 (trench 21) in a plan view in the same way as the first contact wiring layer 26. In the present preferred embodiment, the first contact 59 is formed so as to be linear along the element isolation portion 7 and so as to have a closed annular shape in a plan view. In other words, the first contact 59 is formed in a closed annular shape that overlaps with the element isolation portion 7 and with the first contact wiring layer 26 over the whole periphery of the first contact 59 in a plan view.

Additionally, the first contact 59 is made of tungsten (W) in the present preferred embodiment, and yet may be made of other conductive materials (such as aluminum (Al) and copper (Cu)). In that case, needless to say, a barrier layer, such as TiN, may be used.

The first drain wiring layer 43 is formed on the drain region 12. The first drain wiring layer 43 is formed so as to be fitted in the active region 30. In other words, the first drain wiring layer 43 has both end portions each of which is formed at a more inward position than an outer periphery of the active region 30. For example, the source region 10 and the body contact region 11 may be disposed between a pair of the first drain wiring layers 43 that face each other with the first source wiring layer 42 between the first drain wiring layers 43 in a plan view as shown in FIG. 3.

The first drain wiring layer 43 is connected to the drain region 12 by means of a first drain contact 47 buried in the first interlayer insulating film 15. A plurality of the first drain contacts 47 are arranged in a dot shape with intervals therebetween along the first direction A. Additionally, the first drain contact 47 is made of tungsten (W) in the present preferred embodiment, and yet may be made of other conductive materials (such as aluminum (Al) and copper (Cu)). In that case, needless to say, a barrier layer, such as TiN, may be used.

The first gate wiring layer 44 is formed on the gate electrode 14 (in the present preferred embodiment, the second extension portion 39). The first gate wiring layer 44 is formed outside the active region 30 and inside the first element region 2. In other words, the first gate wiring layer 44 has both end portions each of which is formed at a more inward position than the element isolation portion 7. In the present preferred embodiment, the first gate wiring layer 44 is formed at a more inward position than an outer periphery of the second extension portion 39 of the gate electrode 14 in a plan view as shown in FIG. 3.

The first gate wiring layer 44 is connected to the gate electrode 14 (in the present preferred embodiment, the second extension portion 39) by means of a first gate contact 48 buried in the first interlayer insulating film 15. A plurality of the first gate contacts 48 are arranged in a dot shape with intervals therebetween along the second direction B. Additionally, the first gate contact 48 is made of tungsten (W) in the present preferred embodiment, and yet may be made of other conductive materials (such as aluminum (Al) and copper (Cu)). In that case, needless to say, a barrier layer, such as TiN, may be used.

The second interlayer insulating film 17 is formed on the first interlayer insulating film 15 so as to cover the first wiring layer 16. The second interlayer insulating film 17 is made of silicon oxide ($SiO_2$) in the present preferred embodiment, and yet may be made of another insulating material (such as silicon nitride (SiN)). Additionally, the second interlayer insulating film 17 may be formed so as to have a layered structure made of a plurality of materials, such as silicon oxide and silicon nitride. Additionally, the thickness of the second interlayer insulating film 17 may be, for example, 0.3 µm to 2.0 µm.

The second wiring layer 18 is formed on the second interlayer insulating film 17. The second wiring layer 18 includes a main layer 49 (for example, aluminum (Al) layer) and a barrier layer 50 (for example, Ti/TiN layered structure) by which the main layer 49 is sandwiched from the up-down direction in the present preferred embodiment, and yet may be made of another conductive material (for example, copper (Cu)).

The second wiring layer 18 may include a second drain wiring layer 51 and a second gate wiring layer 52.

The second drain wiring layer 51 is formed so as to cover the first source wiring layer 42 and the first drain wiring layer 43. The second drain wiring layer 51 may include a contact portion 53 that is formed on the active region 30 and that covers both the first source wiring layer 42 and the first drain wiring layer 43 and a drawn-out portion 54 that crosses both the element isolation portion 7 and the first contact wiring layer 26 from the contact portion 53 and that is drawn out toward the outside of the first element region 2. The second drain wiring layer 51 (contact portion 53) is formed so as to cross an upper region of the source region 10 and so as to straddle between the pair of drain regions 12 as shown in FIGS. 4 and 5.

The second drain wiring layer 51 (in the present preferred embodiment, contact portion 53) is connected to the first drain wiring layer 43 by means of the second drain contact 55 buried in the second interlayer insulating film 17. A plurality of the second drain contacts 55 are arranged in a dot shape with intervals therebetween along the first direction A. Additionally, the second drain contact 55 is made of tungsten (W) in the present preferred embodiment, and yet may be made of other conductive materials (such as aluminum (Al) and copper (Cu)). In that case, needless to say, a barrier layer, such as TiN, may be used.

The second gate wiring layer 52 is formed so as to cover the first gate wiring layer 44. The second gate wiring layer 52 may include a contact portion 56 that is formed on the first gate wiring layer 44 and that covers the first gate wiring layer 44 and a drawn-out portion 57 that crosses both the element isolation portion 7 and the first contact wiring layer 26 from the contact portion 56 and that is drawn out toward the outside of the first element region 2.

The second gate wiring layer 52 (in the present preferred embodiment, contact portion 56) is connected to the first gate wiring layer 44 by means of the second gate contact 58 buried in the second interlayer insulating film 17. A plurality of the second gate contacts 58 are arranged in a dot shape with intervals therebetween along the second direction B. Additionally, the second gate contact 58 is made of tungsten (W) in the present preferred embodiment, and yet may be made of other conductive materials (such as aluminum (Al) and copper (Cu)). In that case, needless to say, a barrier layer, such as TiN, may be used.

<<Structure of Element Isolation Portion 7>>

Figure 6:
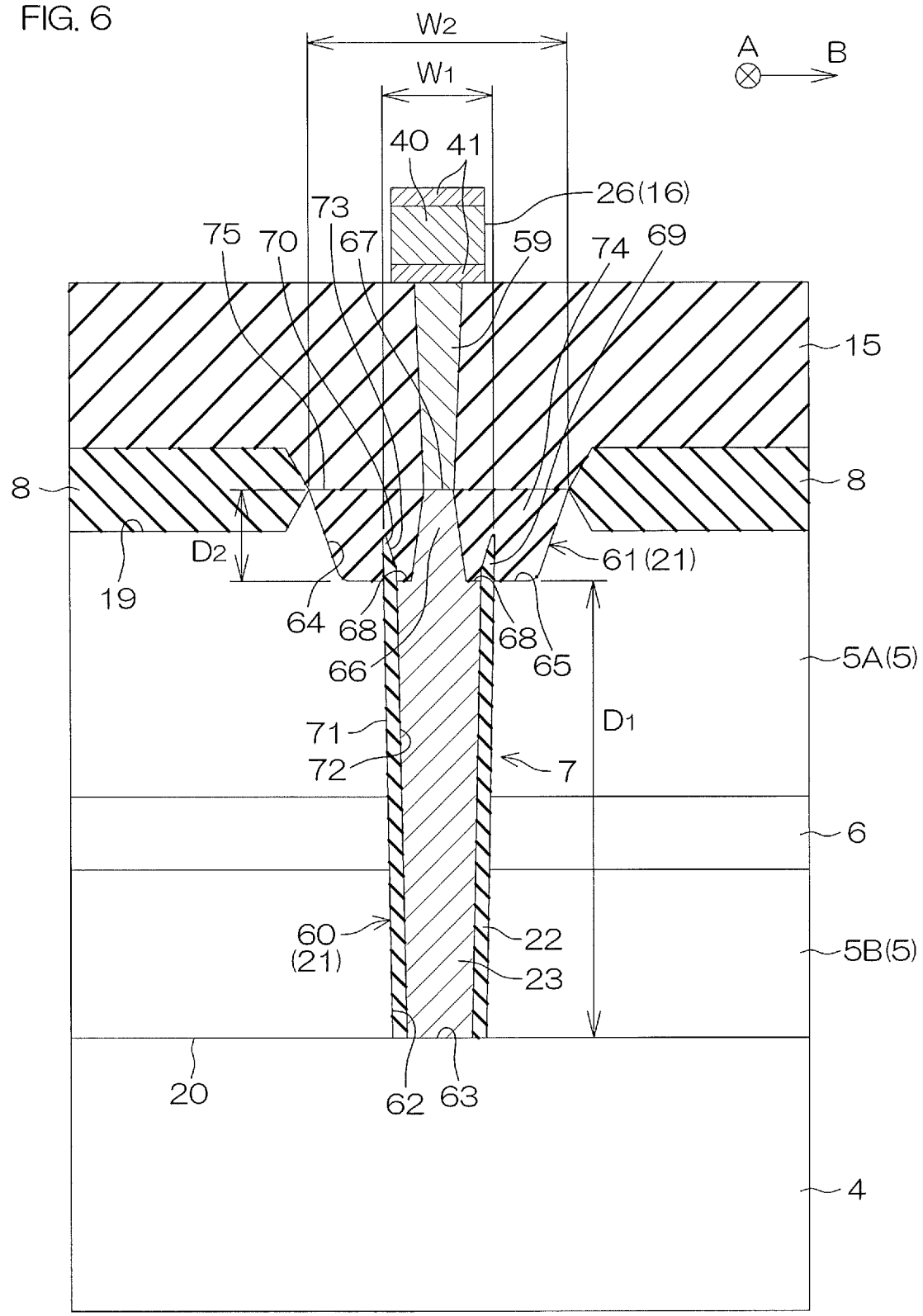
FIG. 6 is an enlarged view of a main part of an element isolation portion of FIGS. 4 and 5.

FIG. 6 is an enlarged view of a main part of the element isolation portion 7 of FIGS. 4 and 5. Next, a detailed structure of the element isolation portion 7 will be described.

The trench 21 may include a first trench 60 and a second trench 61 as shown in FIG. 6.

The first trench 60 is formed so as to reach the semiconductor substrate 4 through the buried layer 6. The second trench 61 is formed at a front surface portion of the semiconductor layer 5 so as to be continuous from an upper end of the first trench 60. In other words, the trench 21 may include the second trench 61 formed downwardly from the element principal surface 19 of the semiconductor layer 5 in the thickness direction of the semiconductor layer 5 and the first trench 60 formed downwardly from a bottom portion of the second trench 61 in the thickness direction of the semiconductor layer 5. The first trench 60 may straddle between the upper semiconductor layer 5A and the lower semiconductor layer 5B on the boundary of the buried layer 6.

The first trench 60 may have a width $W_1$ of, for example, 0.2 μm to 20 μm. If the first trench 60 has a tapered shape in which its width becomes smaller in proportion to an increase in depth in a cross-sectional view as shown in FIG. 6, the width $W_1$ may be the maximum width of the first trench 60. Additionally, the depth $D_1$ of the first trench 60 may be, for example, 2 μm to 100 μm.

The first trench 60 has a side surface 62 and a bottom surface 63. The side surface 62 of the first trench 60 may be inclined with respect to the bottom surface 63. The side surface 62 of the first trench 60 is formed by the upper semiconductor layer 5A, the buried layer 6, and the lower semiconductor layer 5B in order from the-element-principal-surface-19 side of the semiconductor layer 5. The bottom surface 63 of the first trench 60 is formed by the semiconductor substrate 4. In other words, the side surface 62 and the bottom surface 63 of the first trench 60 may be made of semiconductors that differ from each other in impurity concentration. More specifically, the bottom surface 63 of the first trench 60 may be made of a first conductive type first semiconductor (in the present preferred embodiment, $p^+$ type semiconductor substrate 4), and the side surface 62 of the first trench 60 may be made of a second semiconductor (in the present preferred embodiment, $n^-$ type semiconductor layer 5) that is a second-conductivity type opposite to the first-conductivity type and that has an impurity concentration lower than the bottom surface.

The second trench 61 may have a width $W_2$ wider than the first trench 60. The width $W_2$ may be 0.2 μm to 1000 μm. If the second trench 61 has a tapered shape in which its width becomes smaller in proportion to an increase in depth in a cross-sectional view as shown in FIG. 6, the width $W_2$ may be the maximum width of the second trench 61. Additionally, the second trench 61 may have a depth $D_2$ shallower than the first trench 60. The depth $D_2$ may be, for example, 0.05 μm to 2 μm. Thus, the first trench 60 and the second trench 61 have mutually-different depths. For example, the first trench 60 may be referred to as a DTI (Deep Trench Isolation) structure, and the second trench 61 may be referred to as an STI (Shallow Trench Isolation) structure. Additionally, the second trench 61 has a side surface 64 and a bottom surface 65. The side surface 64 of the second trench 61 may be inclined with respect to the bottom surface 65.

The first insulating film 22 is selectively formed at the side surface 62 of the first trench 60, and the semiconductor substrate 4 is exposed at the bottom surface 63 of the first trench 60.

The first buried layer 23 is buried in the inside of the first insulating film 22. The first buried layer 23 may be electrically connected to the semiconductor substrate 4 exposed from the first insulating film 22. The first buried layer 23 may include a first projection portion 66 that selectively protrudes into the second trench 61. In other words, the first buried layer 23 may be buried in the inside of the first insulating film 22 in the first trench 60, and may protrude upwardly from the bottom surface 65 of the second trench 61. The first contact 59 is connected to the first projection portion 66 of the first buried layer 23.

The first buried layer 23 may have a first upper surface 67 that is an upper surface of the first projection portion 66 and a second upper surface 68 formed at a level lower than the first upper surface 67. In other words, the first projection portion 66 may be formed by allowing a part of a top portion of the first buried layer 23 to selectively protrude. In the present preferred embodiment, the second upper surface 68 is formed at one side and the other side between which the first projection portion 66 is sandwiched in a direction intersecting a direction in which the first contact 59 extends. For example, FIG. 6 is a cross-sectional view along the second direction B, and shows an aspect in which the first contact 59 extends in the first direction A. Therefore, the second upper surface 68 is formed at one side and the other side between which the first projection portion 66 is sandwiched in the second direction B.

The first insulating film 22 may have a second projection portion 69 that protrudes to a higher position than the second upper surface 68 of the first buried layer 23. The second projection portion 69 may have its top portion at a position between both ends in the depth direction of the second trench 61. Therefore, the amount of protrusion of the second projection portion 69 may be smaller than the depth $D_2$ of the second trench 61. Additionally, the first and second projection portions 66 and 69 may extend upwardly at a distance from each other.

The thickness of an upper portion 70 of the first insulating film 22 may become thinner in proportion to progress toward the upper side in the depth direction of the first trench 60. For example, the first insulating film 22 may include a first surface 71 contiguous to the side surface 62 of the first trench 60, a second surface 72 that is formed in substantially parallel with the first surface 71 and that is contiguous to the first buried layer 23, and a third surface 73 that is continuous from the second surface 72 in the upper portion 70 of the first insulating film 22 and that is inclined toward the first surface 71. In a part (upper portion 70) of the first insulating film 22 whose thickness changes thinly), its entirety may be formed at the second projection portion 69 as shown in FIG. 6, or its part may be formed in the first trench 60.

The second buried layer 74 is buried in the second trench 61. The second buried layer 74 is made of silicon oxide ($SiO_2$) in the present preferred embodiment, and yet may be made of another insulating material (such as silicon nitride (SiN)). The second trench 61 may have an upper surface 75 that is flush with the first upper surface 67 of the first buried layer 23. Therefore, a surface that is formed by the first upper surface 67 of the first buried layer 23 and by the upper surface 75 of the second buried layer 74 may be exposed at an opening end of the second trench 61. In other words, the first buried layer 23 may pass through the second buried layer 74 and be selectively exposed from the upper surface 75 of the second buried layer 74.

<<Method of Forming Element Isolation Portion 7>>

FIG. 7A to FIG. 7G are views showing steps related to the formation of the element isolation portion 7. Next, a method of forming the element isolation portion 7 shown in FIG. 6 will be described.

Figure 7A:
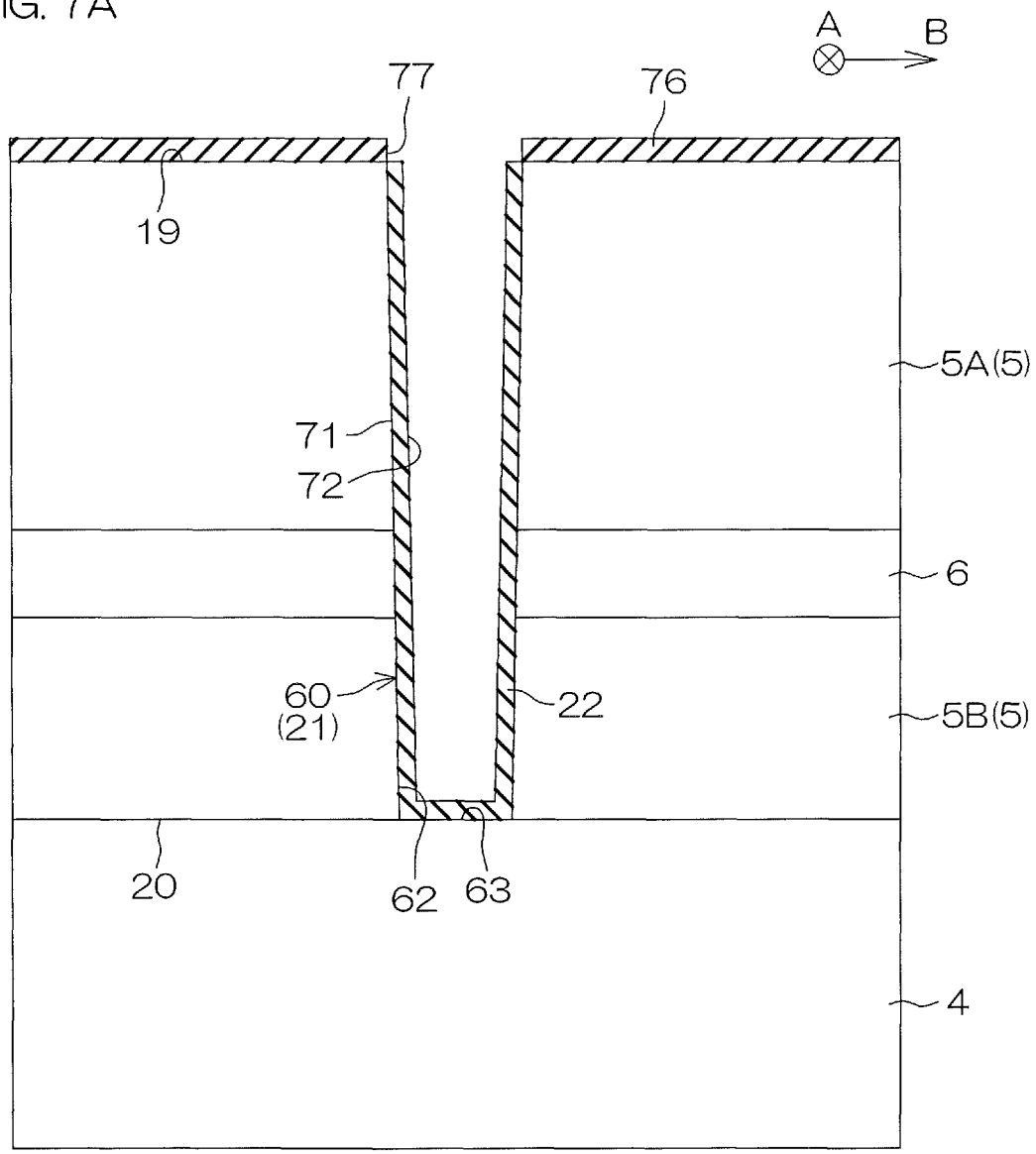
FIG. 7A is a view showing a step related to the formation of the element isolation portion.

First, a mask 76 is formed at the element principal surface 19 of the semiconductor layer 5 as shown in FIG. 7A. The mask 76 may be, for example, a hard mask made of SiN. The mask 76 has an opening 77 that exposes a region in which the first trench 60 is to be formed. Thereafter, the semiconductor layer 5 is subjected to dry etching through the mask 76, and, as a result, the first trench 60 is formed. After the formation of the first trench 60, an inner surface of the first trench 60 is thermally oxidized while the mask 76 remains there. Hence, the first insulating film 22 is formed at the side surface 62 and the bottom surface 63 of the first trench 60. Thereafter, the mask 76 is removed.

Figure 7B:
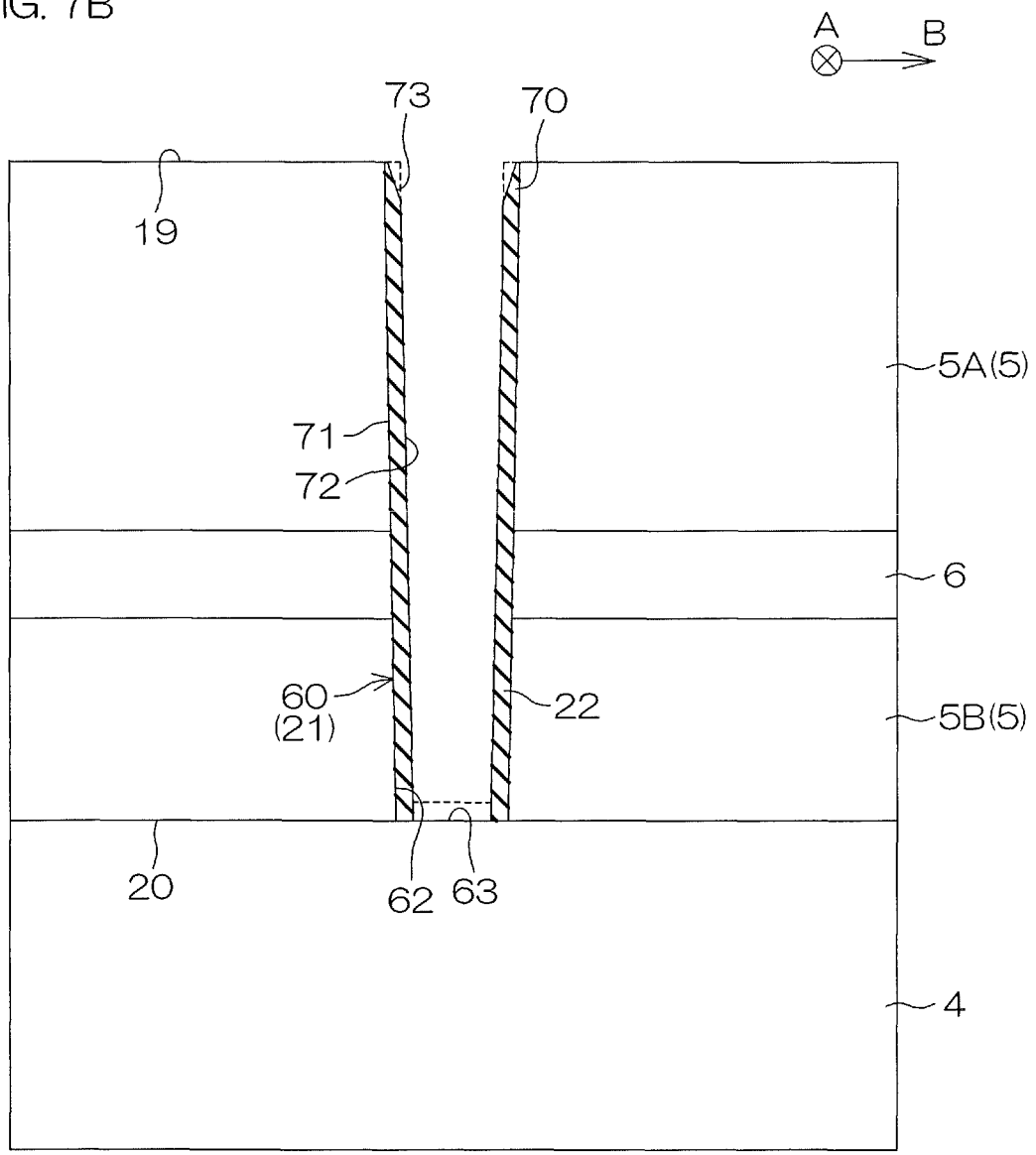
FIG. 7B is a view showing a step subsequent to that of FIG. 7A.

Thereafter, the first insulating film 22 on the bottom surface 63 of the first trench 60 is selectively removed by, for example, etchback as shown in FIG. 7B. Hence, the semiconductor substrate 4 is exposed at the bottom surface 63 of the first trench 60. At this time, the upper portion 70 of the first insulating film 22 is partially removed, and a part in which the thickness thinly changes is formed as shown by the broken line in FIG. 7B.

Figure 7C:
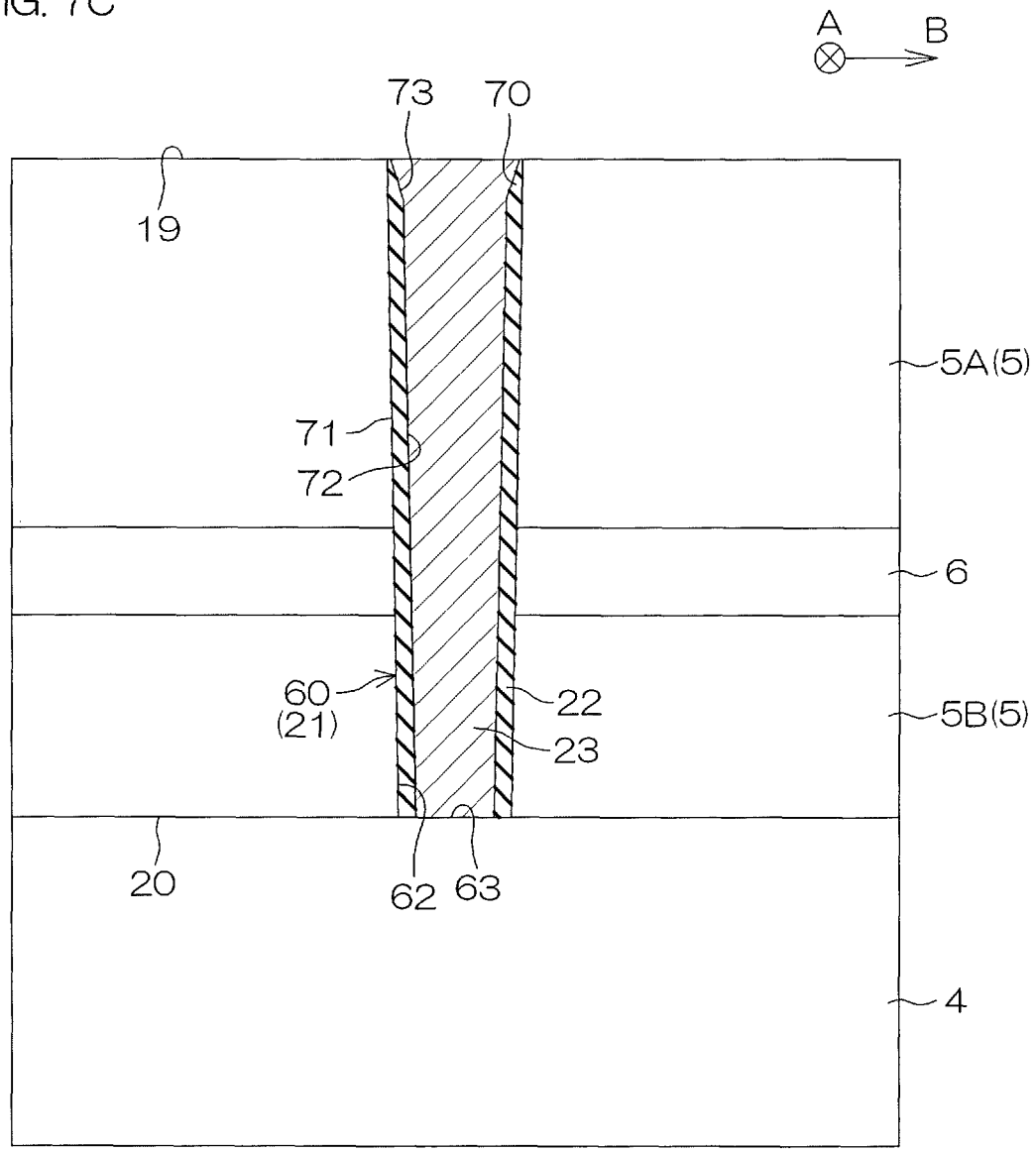
FIG. 7C is a view showing a step subsequent to that of FIG. 7B.

Thereafter, the first buried layer 23 is buried in the first trench 60 by, for example, a CVD method as shown in FIG. 7C.

Figure 7D:
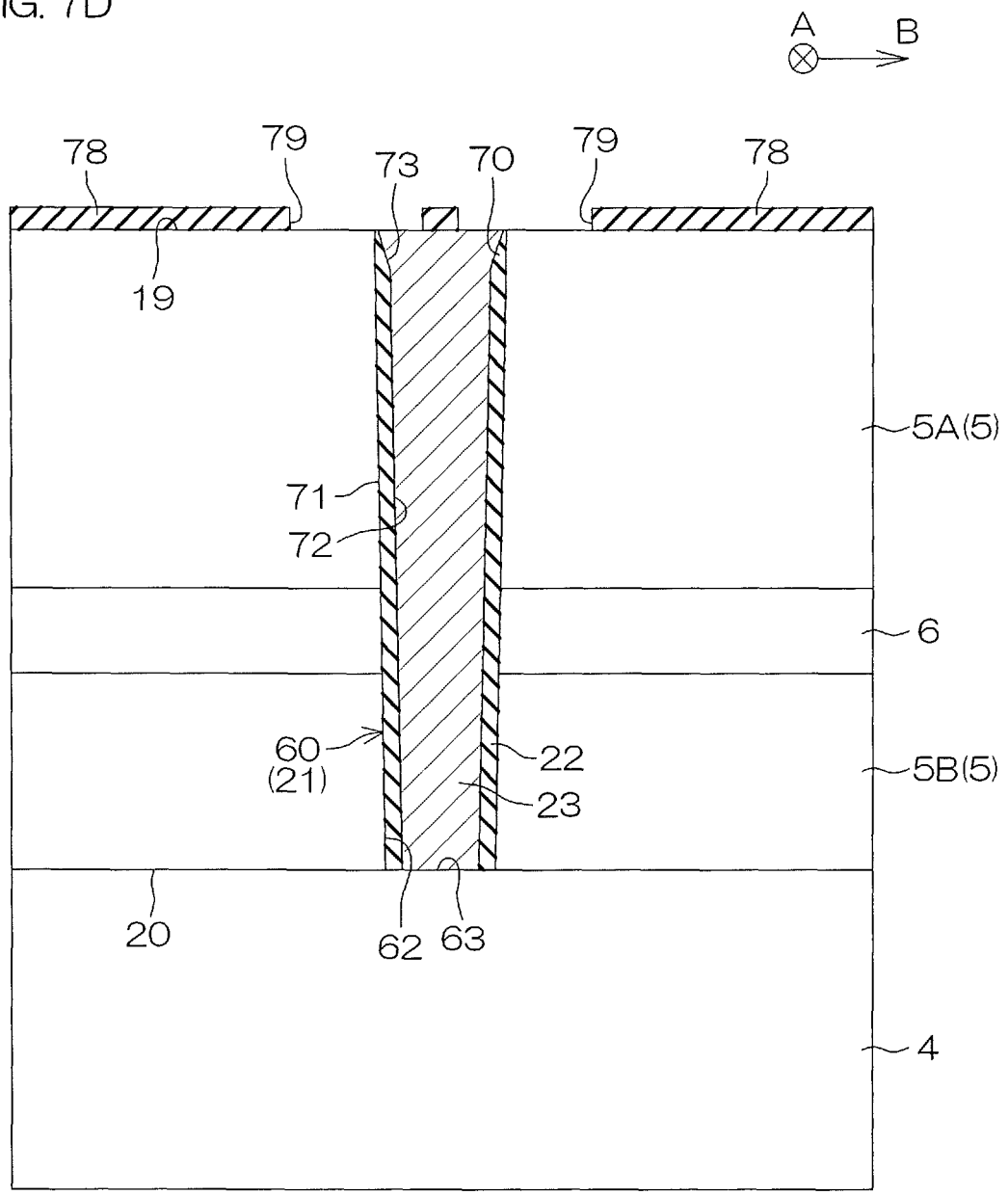
FIG. 7D is a view showing a step subsequent to that of FIG. 7C.

Thereafter, a mask 78 is formed at the element principal surface 19 of the semiconductor layer 5 as shown in FIG. 7D. The mask 78 may be a hard mask made of, for example, SiN. The mask 78 has an opening 79 that exposes a region in which the second trench 61 is to be formed, and yet covers a part of the upper surface of the first buried layer 23. The part, which is covered by the mask 78, of the first buried layer 23 is a part in which the first projection portion 66 is formed.

Figure 7E:
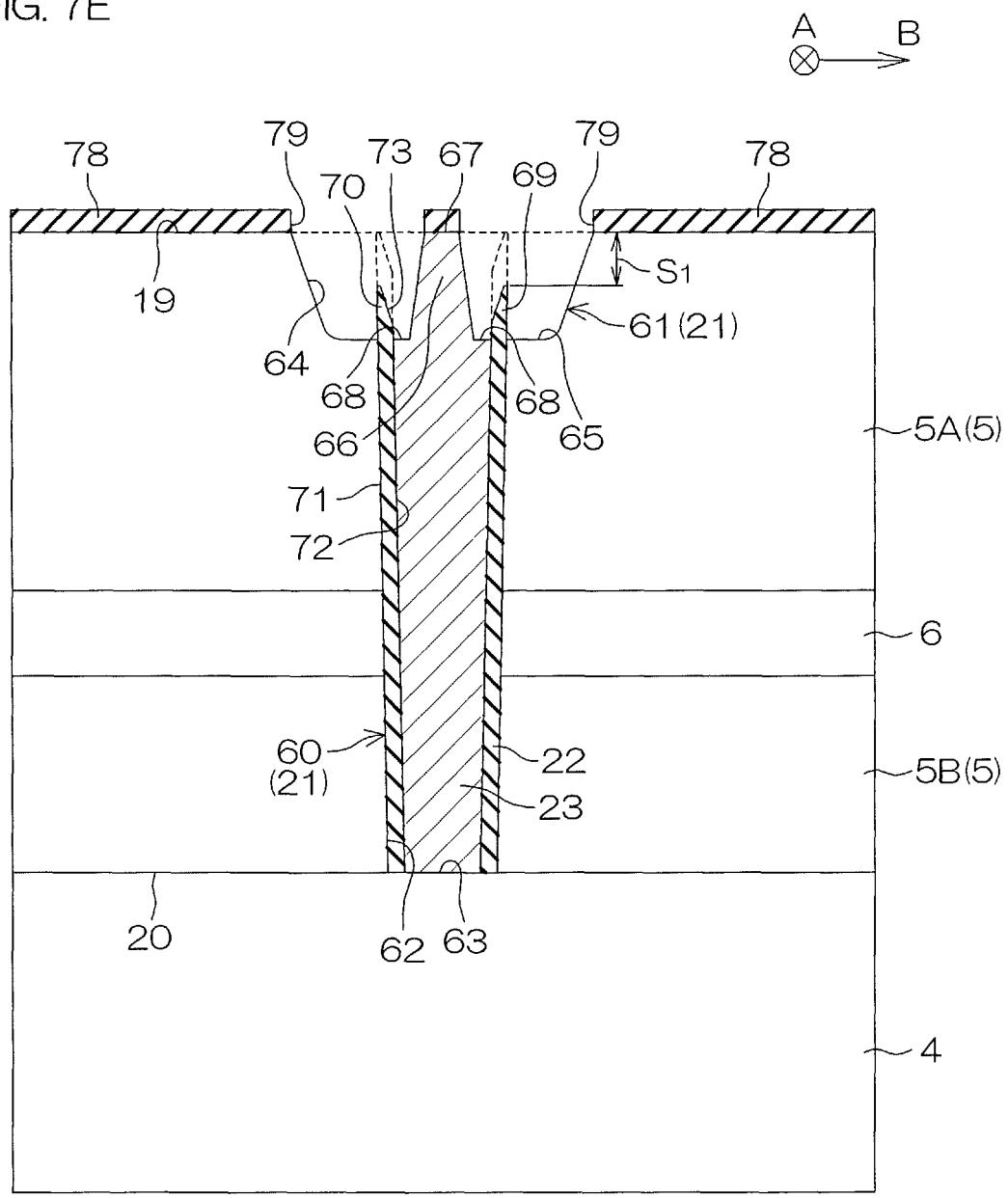
FIG. 7E is a view showing a step subsequent to that of FIG. 7D.

Thereafter, the semiconductor layer 5 is subjected to dry etching through the mask 78 as shown in FIG. 7E. Hence, a part of the semiconductor layer 5 made of single-crystal silicon is removed, and, as a result, the second trench 61 is formed, and a part of the first buried layer 23 made of polysilicon is removed, and, as a result, the first projection portion 66 is formed. At this time, a part of the first insulating film 22 made of silicon oxide is also removed. From the fact that silicon oxide is slower in etching rate than silicon, the first insulating film 22 remains in the second trench 61 as the second projection portion 69, and a level difference S1 is formed between an upper end of the first insulating film 22 and the element principal surface 19 of the semiconductor layer 5.

Figure 7F:
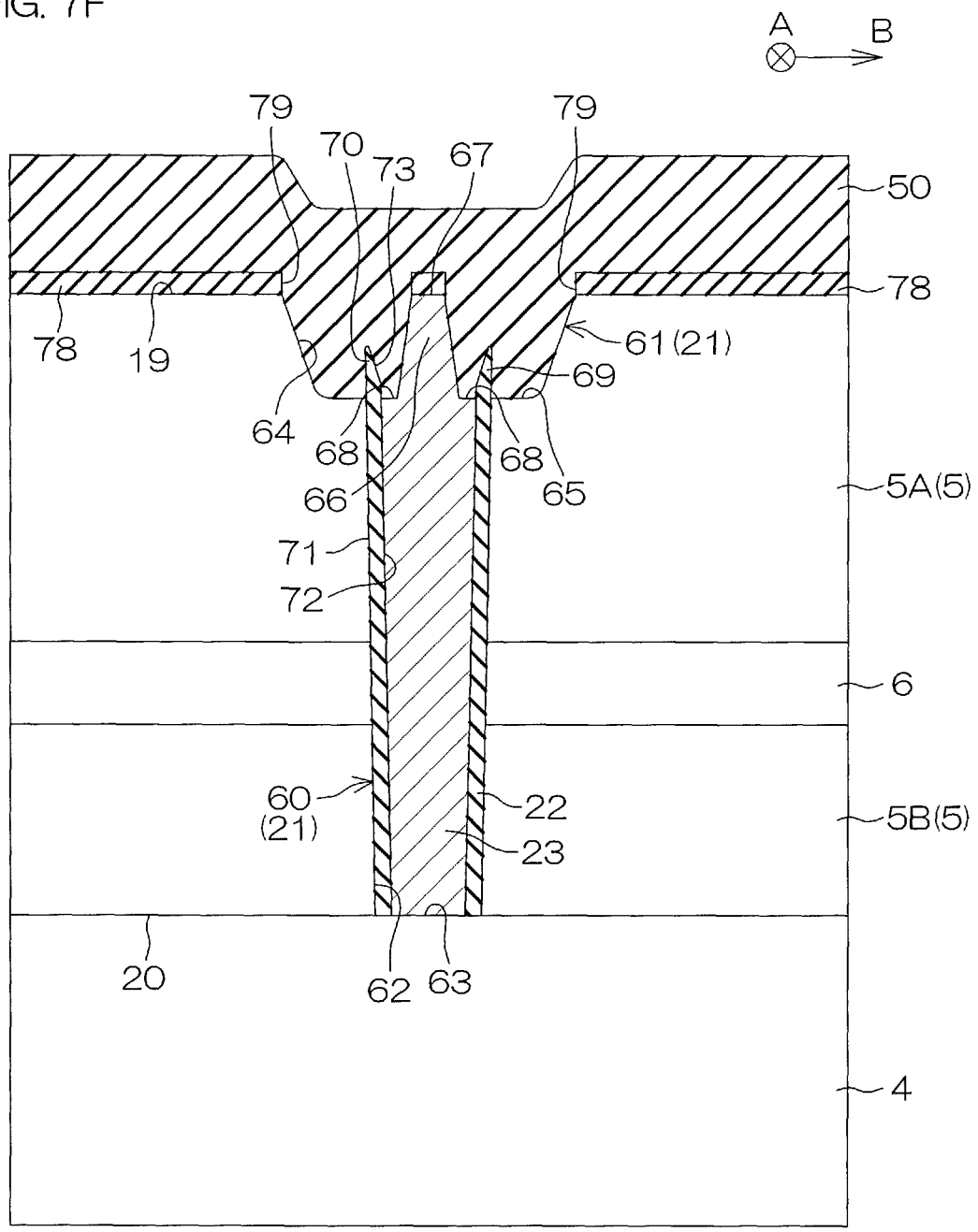
FIG. 7F is a view showing a step subsequent to that of FIG. 7E.

Thereafter, an insulating material 80 is buried in the second trench 61 by, for example, the CVD method as shown in FIG. 7F.

Figure 7G:
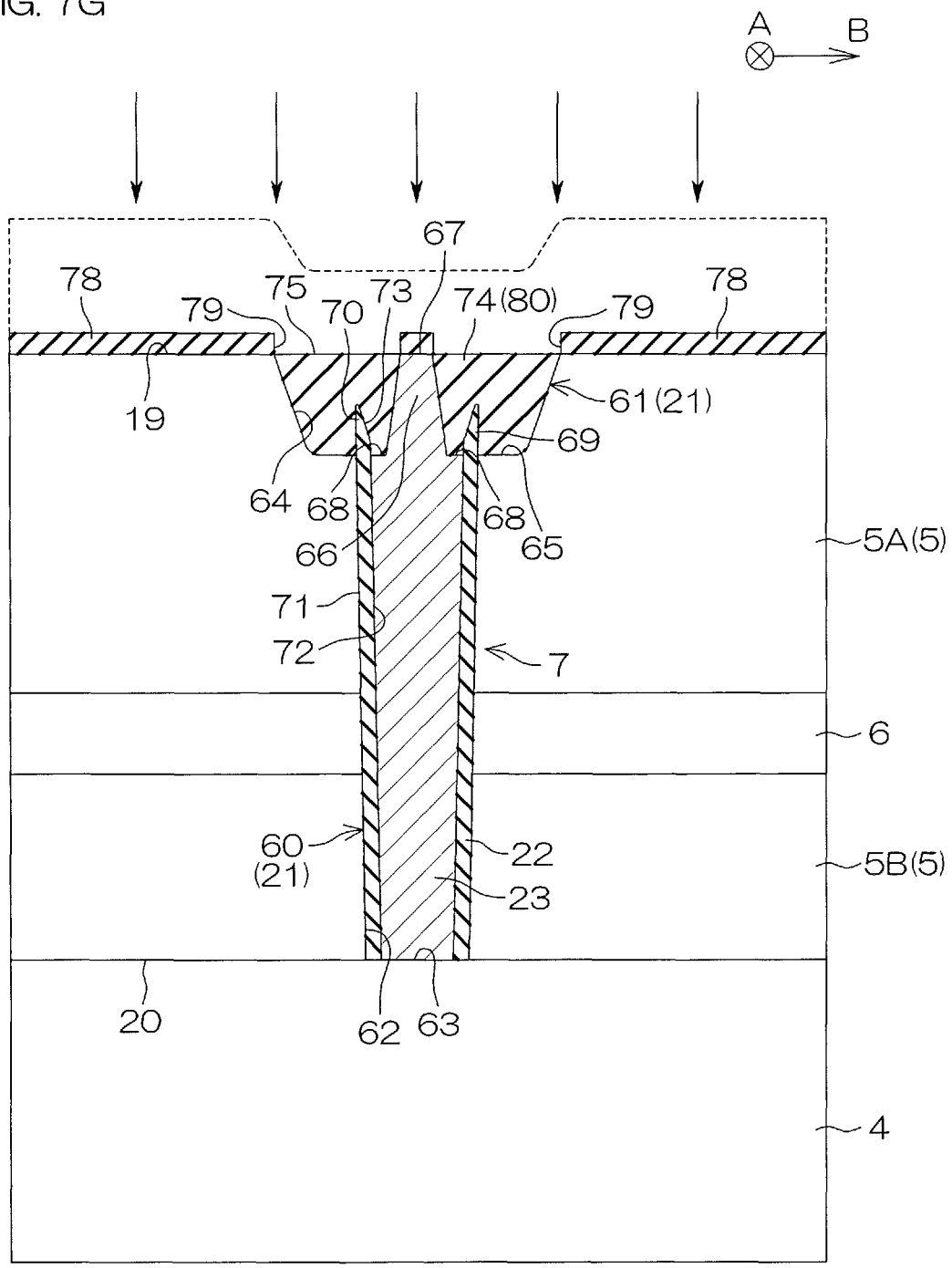
FIG. 7G is a view showing a step subsequent to that of FIG. 7F.

Next, the insulating material 80 outside the second trench 61 is removed by, for example, etchback, and the second buried layer 74 is formed as shown in FIG. 7G. Thereafter, the mask 78 is removed. Through these steps mentioned above, it is possible to form the element isolation portion 7 shown in FIG. 6.

<<Effect of Semiconductor Device 1>>

As described above, with this semiconductor device 1, the first contact 59 is formed in a linear shape, and therefore it is possible to restrain contact resistance against the element isolation portion 7 (first buried layer 23) more excellently than in a case in which it is formed in, for example, a dot shape.

For example, in the semiconductor device 1, an npnp parasitic thyristor is formed by the $n^+$ type source region 10, the $p^-$ type body region 9, the $n^-$ type semiconductor layer 5, and the $p^+$ type semiconductor substrate 4. There is a case in which this type of parasitic thyristor is turned on because of, for example, ESD (Electro-Static Discharge). Therefore, there is a possibility that a localized high electric current will be generated in a MISFET that includes the source region 10 and the body region 9, thus leading to destruction. On the other hand, with the semiconductor device 1, it is possible to efficiently absorb a substrate current by means of the first contact 59 connected to the element isolation portion 7 (first buried layer 23) with comparatively low contact resistance. As a result, it is possible to improve an ESD withstand current rating of the semiconductor device 1.

Second Preferred Embodiment

Figure 8:
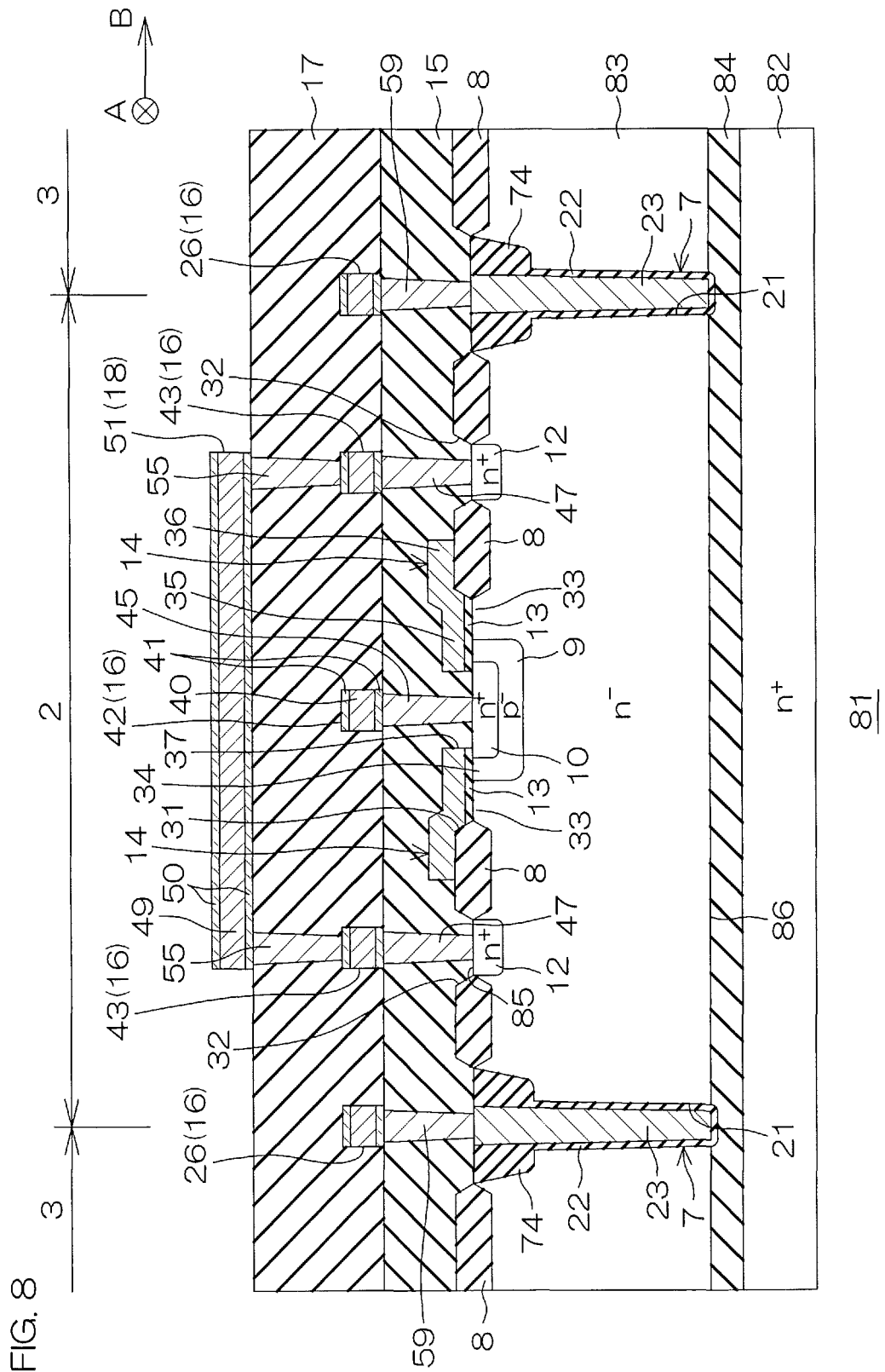
FIG. 8 is a schematic cross-sectional view of a semiconductor device according to a second preferred embodiment of the present disclosure.
Figure 9:
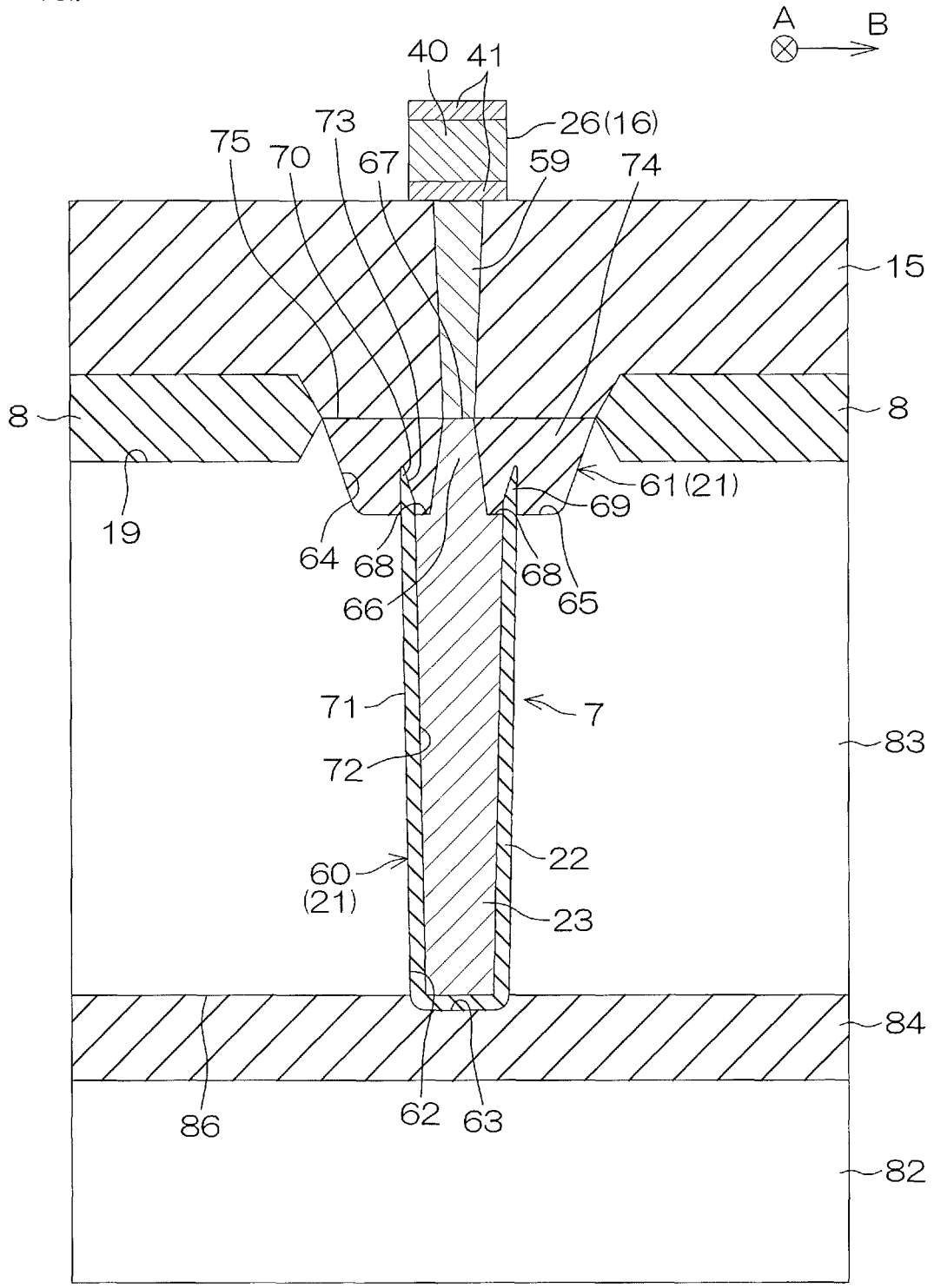
FIG. 9 is an enlarged view of a main part of an element isolation portion of FIG. 8.

FIG. 8 is a schematic cross-sectional view of a semiconductor device 81 according to a second preferred embodiment of the present disclosure. FIG. 9 is an enlarged view of a main part of the element isolation portion 7 of FIG. 8. In FIGS. 8 and 9, the same reference sign is given to a component corresponding to each component described in FIGS. 4 and 6, and a detailed description of this component is omitted.

The semiconductor device 81 of the second preferred embodiment may include a semiconductor substrate 82, a semiconductor layer 83, and an insulating layer 84, instead of the semiconductor substrate 4, the semiconductor layer 5, and the buried layer.

The semiconductor substrate 82 is made of a single-crystal silicon (Si) substrate in the present preferred embodiment, and yet may be a substrate made of another material (for example, silicon carbide (SiC)). The semiconductor substrate 82 is an n$^+$ type in the present preferred embodiment. The semiconductor substrate 82 may have an impurity concentration of, for example, $1\times10^{19}$ cm$^{-3}$ to $5\times10^{21}$ cm$^{-3}$. Additionally, the thickness of the semiconductor substrate 82 may be, for example, 500 µm to 800 µm when the semiconductor substrate 82 is in a not-yet-ground state.

The semiconductor layer 83 may be, for example, a layer stuck onto the semiconductor substrate 82 through the insulating layer 84. The semiconductor layer 83 is contiguous to the insulating layer 84, and is stacked on the insulating layer 84. The semiconductor layer 83 has an element principal surface 85 and a junction surface 86 facing a side opposite to the element principal surface 85 in the thickness direction of the semiconductor layer 83. The element principal surface 85 is a surface at which the element regions 2 and 3 have been formed. The semiconductor layer 83 having the element principal surface 85 may be referred to as an active layer. On the other hand, the junction surface 86 is a surface contiguous to the insulating layer 84.

The semiconductor layer 83 has the same conductivity type as the semiconductor substrate 82, and is an n$^-$ type in the present preferred embodiment. The semiconductor layer 83 may have an impurity concentration of, for example, $5\times10^{14}$ cm$^{-3}$ to $1\times10^{17}$ cm$^{-3}$. Additionally, the thickness of the semiconductor layer 83 may be, for example, 3 µm to 20 µm.

The insulating layer 84 may be sandwiched between the semiconductor substrate 82 and the semiconductor layer 83. The insulating layer 84 is made of silicon oxide (SiO$_2$) in the present preferred embodiment, and may have a thickness of, for example, 5 µm to 20 µm. Additionally, the insulating layer 84 may be referred to as a buried layer buried in a boundary portion between the semiconductor substrate 82 and the semiconductor layer 83. In this case, the insulating layer 84 may be referred to as a BOX (Buried Oxide) layer. Additionally, the substrate formed by a layered structure consisting of the semiconductor substrate 82, the insulating layer 84, and the semiconductor layer 83 may be referred to as a SOI (Silicon On Insulator) substrate.

The trench 21 may be formed so as to reach the insulating layer 84 from the element principal surface 85 of the semiconductor layer 83. In other words, the bottom portion of the trench 21 may be formed at the insulating layer 84, and may be away from the semiconductor substrate 82. Additionally, the first insulating film 22 may be formed so as to cover both the side surface 62 and the bottom surface 63 of the first trench 60.

Likewise, in the semiconductor device 81 of the second preferred embodiment, the structure of the element isolation portion 7 may be a combination of the DTI structure and the STI structure as shown in FIG. 8.

Likewise, in the semiconductor device 81, the first contact 59 is formed in a linear shape, and therefore it is possible to restrain contact resistance against the element isolation portion 7 (first buried layer 23) more excellently than in a case in which it is formed in, for example, a dot shape.

The preferred embodiments of the present disclosure have been described as above, and yet the present disclosure can be embodied in other modes.

Figure 10:
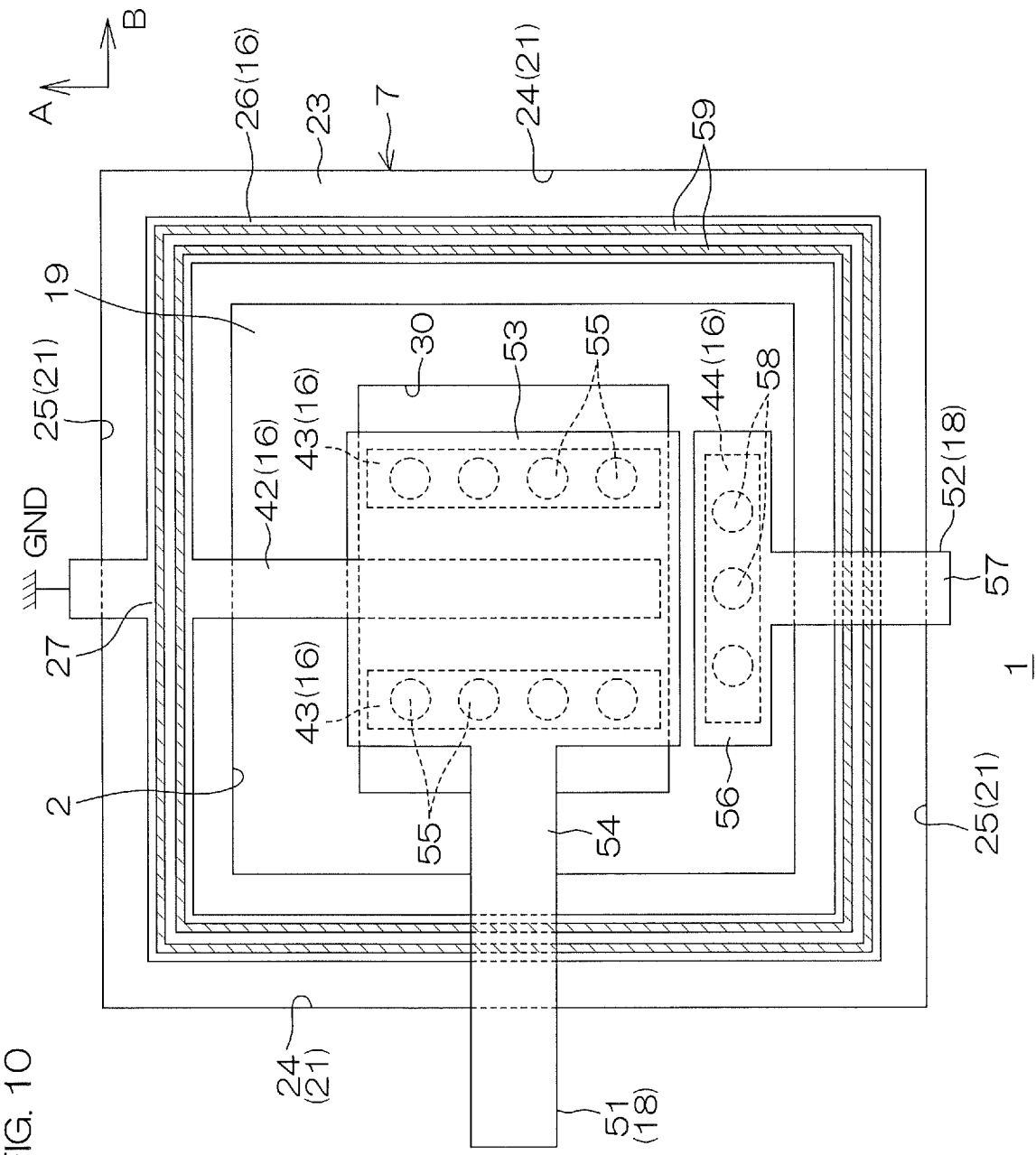
FIG. 10 is a view showing a modification of a pattern of a DTI contact of FIG. 2.

For example, the first contact 59 may include a plurality of first contacts 59 that extend while being arranged side by side with each other. As an example, a plurality of linear first contacts 59 may be each formed in a closed annular shape as shown in FIG. 10.

Figure 11:
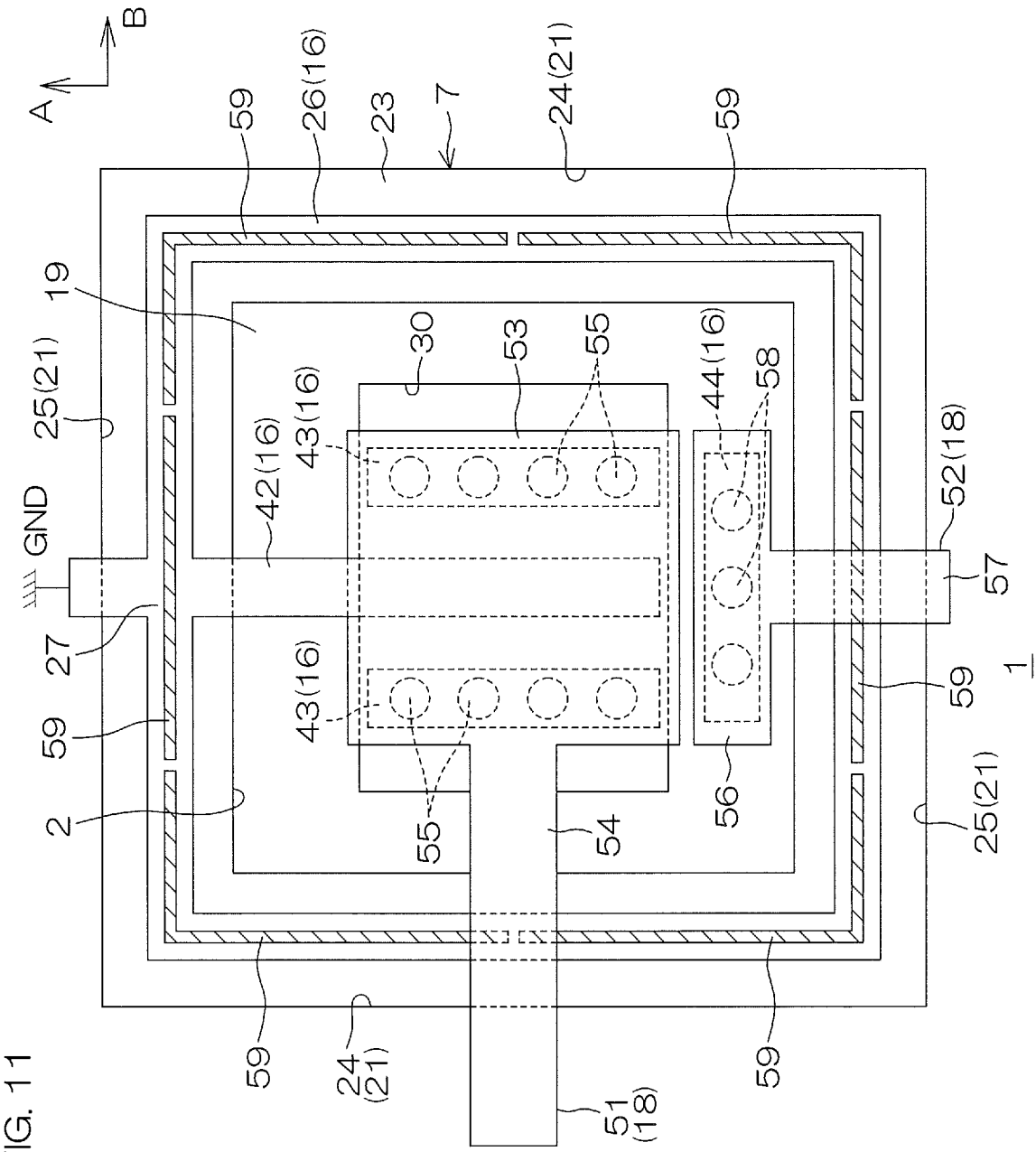
FIG. 11 is a view showing a modification of the pattern of the DTI contact of FIG. 2.

Additionally, the first contact 59 may include a plurality of first contacts 59 that are intermittently formed along the element isolation portion 7 as shown in FIG. 11.

Additionally, a configuration in which the conductivity type of each of the semiconductor portions has been reversed may be employed in the preferred embodiments described above. In other words, a semiconductor device 1 in which the p type portion has been changed into an n type whereas the n type portion has been changed into a p type may be employed.

Besides, various design changes can be made within the scope of the subject matter recited in the appended claims.

Additionally, preferred aspects extracted from the preferred embodiments described above are appended as follows.

(Appendix 1)

A semiconductor device is provided that includes:

a semiconductor substrate;

a semiconductor layer formed on the semiconductor substrate;

a buried layer formed so as to be contiguous to the semiconductor layer;

an element isolation portion that reaches the semiconductor substrate through the buried layer from a front surface of the semiconductor layer and that defines an element region in the semiconductor layer; and a first contact that is formed in a linear shape along the element isolation portion in a plan view and that is electrically connected to the element isolation portion.

(Appendix 2)

The semiconductor device according to Appendix 1 may be provided in which the element isolation portion includes a trench that passes through the buried layer from the front surface of the semiconductor layer and that has a bottom portion at the semiconductor substrate, a first insulating film formed at a side surface of the trench, and an electroconductive first buried body that is buried in an inside of the first insulating film and that is connected to the semiconductor substrate, and the first contact is connected to the first buried body.

(Appendix 3)

The semiconductor device according to Appendix 2 may be provided in which the trench includes a first trench and a second trench, the second trench being formed at a front surface portion of the semiconductor layer so as to be continuous from an upper end of the first trench, the second trench having a width wider than the first trench and having a depth shallower than the first trench, the semiconductor device further including an insulative second buried body buried in the second trench.

(Appendix 4)

The semiconductor device according to Appendix 3 may be provided in which the first buried body includes a first projection portion that selectively protrudes into the second trench, and the first contact is connected to the first projection portion.

(Appendix 5)

The semiconductor device according to Appendix 4 may be provided in which the first buried body has a second upper surface that is formed at one side and one other side between which the first projection portion is sandwiched in a direction intersecting a direction in which the first contact extends and that is formed at a level lower than a first upper surface of the first projection portion.

(Appendix 6)

The semiconductor device according to Appendix 5 may be provided in which the first insulating film is formed at a side surface of the first trench, and protrudes to a higher position than the second upper surface of the first buried body.

(Appendix 7)

The semiconductor device according to any one of Appendix 3 to Appendix 6 may be provided in which a depth of the first trench is 2 µm to 100 µm, and a depth of the second trench is 0.05 µm to 2 µm.

(Appendix 8)

The semiconductor device according to any one of Appendix 3 to Appendix 7 may be provided in which the first trench includes DTI (Deep Trench Isolation), and the second trench includes STI (Shallow Trench Isolation).

(Appendix 9)

The semiconductor device according to any one of Appendix 2 to Appendix 8 may be provided in which a thickness of an upper portion of the first insulating film becomes thinner in proportion to progress toward an upper side in a depth direction of the first trench.

(Appendix 10)

The semiconductor device according to any one of Appendix 2 to Appendix 9 may be provided in which the first insulating film includes a first surface contiguous to the side surface of the first trench, a second surface that is formed in substantially parallel with the first surface and that is contiguous to the first buried body, and a third surface that is continuous from the second surface in the upper portion of the first insulating film and that is inclined toward the first surface.

(Appendix 11)

The semiconductor device according to any one of Appendix 1 to Appendix 10 may be provided in which the first contact includes a plurality of first contacts that extend while being arranged side by side with each other.

(Appendix 12)

The semiconductor device according to any one of Appendix 1 to Appendix 11 may be provided in which the element isolation portion is formed in a closed annular shape in a plan view, and the first contact includes a first contact that is linear along the element isolation portion and that is formed in a closed annular shape.

(Appendix 13)

The semiconductor device according to any one of Appendix 1 to Appendix 11 may be provided in which the element isolation portion is formed in a closed annular shape in a plan view, and the first contact includes a plurality of first contacts formed intermittently along the element isolation portion.

(Appendix 14)

The semiconductor device according to any one of Appendix 1 to Appendix 13 may be provided in which the semiconductor substrate includes a first conductive type semiconductor substrate, the semiconductor layer includes a second conductive type semiconductor layer having a first impurity concentration, the buried layer includes a buried layer having a second impurity concentration higher than the first impurity concentration, and the element region includes a first conductive type body region formed at a front surface portion of the semiconductor layer and a second conductive type source region formed in the body region.

(Appendix 15)

The semiconductor device according to any one of Appendix 1 to Appendix 14 may be provided in which the first contact is configured to be connected to a ground potential.

This application corresponds to Japanese Patent Application No. 2020-043119 filed with the Japan Patent Office on Mar. 12, 2020, the entire disclosure of which is incorporated herein by reference.

REFERENCE SIGNS LIST

1 Semiconductor device
2 First element region
3 Second element region
4 Semiconductor substrate
5 Semiconductor layer
6 Buried layer
7 Element isolation portion
9 Body region
10 Source region
19 Element principal surface
21 Trench
22 First insulating film
23 First buried layer
59 First contact
60 First trench
61 Second trench
62 (First trench) Side surface
63 (First trench) Bottom surface
64 (Second trench) Side surface
65 (Second trench) Bottom surface
66 (First buried layer) First projection portion
67 (First buried layer) First upper surface
68 (First buried layer) Second upper surface
69 (First insulating film) Second projection portion
70 (First insulating film) Upper portion
71 (First insulating film) First surface
72 (First insulating film) Second surface
73 (First insulating film) Third surface
74 Second buried layer
81 Semiconductor device
82 Semiconductor substrate
83 Semiconductor layer
84 Insulating layer
85 Element principal surface
$W_1$ (First trench) Width
$W_2$ (Second trench) Width
$D_1$ (First trench) Depth
$D_2$ (Second trench) Depth

The invention claimed is:

1. A semiconductor device comprising:

a semiconductor layer;

an element isolation portion that is formed at the semiconductor layer and that defines an element region in the semiconductor layer; and a first contact that is formed in a linear shape along the element isolation portion in a plan view and that is electrically connected to the element isolation portion, wherein the element isolation portion includes a trench, a first insulating film formed at a side surface of the trench, and an electroconductive first buried body that is buried in an inside of the first insulating film and that is connected to a semiconductor substrate of the semiconductor device, the first contact is connected to the first buried body, the trench includes a first trench and a second trench, the second trench being formed in a front surface portion of the semiconductor layer so as to be continuous from an upper end of the first trench, the second trench having a width wider than a width of the first trench, and the second trench having a depth shallower than a depth of the first trench, the semiconductor device further comprises an insulative second buried body buried in the second trench, the first buried body includes a first projection portion that selectively protrudes into the second trench, the first contact is connected to the first projection portion, and the first buried body has upper surfaces that are formed respectively at one side and another side of the first projection portion, so that the upper surfaces at the one side and the other side sandwich the first projection portion, the upper surfaces of the first buried body extending in a direction intersecting a direction in which the first contact extends and being formed at a level lower than an upper surface of the first projection portion.

2. The semiconductor device according to claim 1, further comprising:

the semiconductor substrate, the semiconductor substrate supporting the semiconductor layer; and a buried layer formed so as to be contiguous to the semiconductor layer, wherein the element isolation portion passes through the buried layer from a front surface of the semiconductor layer, and reaches the semiconductor substrate.

3. The semiconductor device according to claim 2, wherein the semiconductor substrate has a first conductivity type, the semiconductor layer has a second conductivity type with a first impurity concentration, the buried layer having a second impurity concentration higher than the first impurity concentration, and the element region includes a body region having the first conductivity type and being formed at the front surface portion of the semiconductor layer, and a source region having the second conductivity type and being formed in the body region.

4. The semiconductor device according to claim 1, wherein the first insulating film is formed at a side surface of the first trench, and extends to a higher position than the upper surfaces of the first buried body.

5. The semiconductor device according to claim 1, wherein a depth of the first trench is 2 μm to 100 μm, and a depth of the second trench is 0.05 μm to 2 μm.

6. The semiconductor device according to claim 1, wherein the first trench includes DTI (Deep Trench Isolation), and the second trench includes STI (Shallow Trench Isolation).

7. The semiconductor device according to claim 1, wherein a thickness of an upper portion of the first insulating film becomes thinner in proportion to progress toward an upper side in a depth direction of the first trench.

8. The semiconductor device according to claim 1, wherein the first insulating film includes a first surface contiguous to a side surface of the first trench, a second surface that is formed substantially in parallel with the first surface and that is contiguous to the first buried body, and a third surface that is continuous from the second surface in an upper portion of the first insulating film and that is inclined toward the first surface.

9. The semiconductor device according to claim 1, wherein the first contact includes a plurality of first contacts that extend while being arranged side by side with each other.

10. The semiconductor device according to claim 1, wherein the element isolation portion is formed in a closed annular shape in a plan view, and the first contact includes a first contact that is linear along the element isolation portion and that is formed in a closed annular shape.

11. The semiconductor device according to claim 1, wherein the element isolation portion is formed in a closed annular shape in a plan view, and the first contact includes a plurality of first contacts formed intermittently along the element isolation portion.

12. The semiconductor device according to claim 1, wherein the first contact is configured to be connected to a ground potential.

* * * * *